US008374136B2

(12) United States Patent
Yin

(10) Patent No.: US 8,374,136 B2
(45) Date of Patent: Feb. 12, 2013

(54) TRANSMISSION DIVERSITY SCHEME ON PHYSICAL UPLINK CONTROL CHANNEL (PUCCH) WITH ACK/NACK DIFFERENTIATION

(75) Inventor: Zhanping Yin, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 643 days.

(21) Appl. No.: 12/573,016

(22) Filed: Oct. 2, 2009

(65) Prior Publication Data

US 2011/0080876 A1 Apr. 7, 2011

(51) Int. Cl.
*H04W 4/00* (2009.01)
(52) U.S. Cl. .................................................. 370/329
(58) Field of Classification Search .................. 370/329
See application file for complete search history.

(56) References Cited

U.S. PATENT DOCUMENTS

| | | | |
|---|---|---|---|
| 6,141,542 A | 10/2000 | Kotzin et al. | |
| 6,173,005 B1 | 1/2001 | Kotzin et al. | |
| 6,584,161 B2 | 6/2003 | Hottinen et al. | |
| 6,775,329 B2 | 8/2004 | Alamouti et al. | |
| 6,917,597 B1 | 7/2005 | Schmidl et al. | |
| 7,002,900 B2 | 2/2006 | Walton et al. | |
| 7,212,578 B2 | 5/2007 | Lee et al. | |
| 8,107,547 B2 * | 1/2012 | Muharemovic et al. | 375/260 |
| 2010/0202559 A1 * | 8/2010 | Luo et al. | 375/295 |
| 2011/0141928 A1 * | 6/2011 | Shin et al. | 370/252 |
| 2011/0170489 A1 * | 7/2011 | Han et al. | 370/328 |

FOREIGN PATENT DOCUMENTS

| | | |
|---|---|---|
| EP | 1 890 397 | 2/2008 |
| JP | 2008-48413 | 2/2008 |

OTHER PUBLICATIONS

Huawei, "Multiple Antenna for PUCCH," R1-100260, Jan. 2010.
Nokia Siemens Networks, Nokia, "On Transmission Diversity for PUCCH Formats 2/2a/2b," R1-100333, Jan. 2010.
LG Electronics, "Payload Increase for PUCCH Format 2/2a/2b," R1-100656, Jan. 2010.
Samsung, "Transmit Diversity for PUCCH Formats 2/2a/2b," R1-100128, Jan. 2010.
Qualcomm Incorporated, "Transmit Diversity for PUCCH Format 2/2a/2b," R1-100689, Jan. 2010.
Sharp, "PUCCH Transmit Diversity for Formats 2/2a/2b in LTE-A," R1-100167, Jan. 2010.
ZTE, "Consideration on Multi-Antenna Transmission for PUCCH Format 2 in LTE-A," R1-100522, Jan. 2010.
Catt, "Multi-Antenna Technique for PUCCH Payload Increase," R1-100025, Jan. 2010.
InterDigital Communications, LLC, "Multi-Antenna Transmission and Coding Schemes for PUCCH Format 2 with Increased Payload," R1-100288, Jan. 2010.

(Continued)

*Primary Examiner* — Derrick Ferris
*Assistant Examiner* — Majid Esmaeilian
(74) *Attorney, Agent, or Firm* — Austin Rapp & Hardman

(57) ABSTRACT

A method for transmitting uplink control information (UCI) using a physical uplink control channel (PUCCH) transmit diversity scheme is described. A UCI is coded with a Reed-Muller code to obtain a coded UCI. The coded UCI is mapped to quadrature phase shift keying (QPSK) symbols to obtain a mapped coded UCI. A phase shift is applied to the mapped coded UCI based on an acknowledge/negative-acknowledge (ACK/NACK) to obtain a phase shifted mapped coded UCI. The mapped coded UCI is sent using a PUCCH resource on a first antenna. The phase shifted mapped coded UCI is sent using a PUCCH resource on a second antenna.

22 Claims, 14 Drawing Sheets

OTHER PUBLICATIONS

MCC Support, "Final Report of 3GPP TSG RAN1 WG1 #58 V1.0.0," R1-093746, Oct. 2009.

MCC Support, "Draft Report of 3GPP TSG RAN1 WGA #59b v0.1.0," R1-10xxxx, Feb. 2010.

Akimoto, Yohsuke et al., "Transmit Diversity Scheme Applied to the Uplink ACK/NACK Transmission of Advanced E-UTRA," IEICE Technical Report RCS2008-249, pp. 219-224, Mar. 2009.

Sharp, "LTE-A Transmit Diversity Schemes for PUCCH Format 1/1a/1b," 3GPP TSG RAN WG1 Meeting #57bis, R1-092340, Jun. 2009.

Sharp, "Views on PUCCH TxD for LTE-A," 3GPP TSG RAN WG1 Meeting #57bis, R1-092343, Jun. 2009.

Panasonic, NTT DoCoMo, "Necessity of the Scrambling for ACK/NACK of PUCCH," 3GPP TSG RAN WG1 Meeting #54, R1-082403, Jun. 2008.

Nakao, Seigo et al., "Performance Improvement of Evolved UTRA Uplink Control Channel for Fast Fading Environments," IEICE Technical Report TSC2008-61, pp. 49-54, Aug. 2008.

Nakao, Seigo et al., "Considerations on the Discontinuous Transmission Detection Performance of the ACK/NACK Signals for E-UTRA Uplink Control Channel," IEICE Technical Report, SIP2008-128, RCS2008-176, pp. 23-28, Jan. 2009.

International Search Report issued for International Patent Application No. PCT/JP2011/052968 on Mar. 22, 2011.

Sharp, "PUCCH TxD with Differentiated ACK/NACK Performance for Format 2/2a/2b," 3GPP TSG-RAN WG1 #58bis, R1-094021, Oct. 2009.

International Search Report issued for International Patent Application No. PCT/JP2010/067695 on Dec. 28, 2010.

LG Electronics et al. "Way Forward for PUCCH Transmit Diversity Scheme," R1-093704 Aug. 2009.

Catt et al., "Way Forward on Uplink Single Antenna Port Mode for UEs with Multiple Transmit Antennas," R1-093698, Aug. 2009.

Qualcomm Europe, "PUCCH Transmit Diversity," R1-093124, Aug. 2009.

Nokia, "Tx Diversity for LTE-Advanced PUCCH," R1-093326, Aug. 2009.

Nokia, "CQI Payload Extension on PUCCH," R1-093328, Aug. 2009.

LG Electronics, "PUCCH TxD Schemes for LTE-A," R1-093254, Aug. 2009.

Panasonic, "Discussion on the Rel-8 Operation Mode for PUCCH of LTE-Advanced UE," R1-093470, Aug. 2009.

Huawei, "Further Discussion on Multiple Antenna Transmission for PUCCH," R1-093049, Aug. 2009.

Huawei, "Performance of UL Multiple Antenna Transmission for PUCCH," R1-093052, Aug. 2009.

Samsung, "UL Transmit Diversity for PUCCH Format 1/1a/1b in LTE-A," R1-093397, Aug. 2009.

Catt, "Multi-Antenna Technique for PUCCH Payload Increase," R1-093539, Aug. 2009.

Catt et al., "Transmit Diversity Schemes for PUCCH Format 1a," R1-093540, Aug. 2009.

NTT DOCOMO, "UL Transmit Diversity Schemes in LTE-Advanced," R1-093508, Aug. 2009.

3GPP TS 36.212 V8.6.0, "Evolved Universal Terrestrial Radio Access (E-UTRA) Multiplexing and channel coding," Mar. 2009.

3GPP TS 36.211 V8.6.0, "Evolved Universal Terrestrial Radio Access (E-UTRA) Physical Channels and Modulation," Mar. 2009.

3GPP TS 36.300 V8.1.0, "Evolved Universal Terrestrial Radio Access (E-UTRA) and Evolved Universal Terrestrial Radio Access Network (E-UTRAN); Overall description," Jun. 2007.

3GPP TS 36.213 V8.6.0, "Evolved Universal Terrestrial Radio Access (E-UTRA) Physical layer procedures," Mar. 2009.

* cited by examiner

TRANSMISSION DIVERSITY SCHEME ON PHYSICAL UPLINK CONTROL CHANNEL (PUCCH) WITH ACK/NACK DIFFERENTIATION

TECHNICAL FIELD

The present invention relates generally to wireless communications and wireless communications-related technology. More specifically, the present invention relates to a transmission diversity scheme on the physical uplink control channel (PUCCH) with ACK/NACK differentiation.

BACKGROUND

Wireless communication devices have become smaller and more powerful in order to meet consumer needs and to improve portability and convenience. Consumers have become dependent upon wireless communication devices and have come to expect reliable service, expanded areas of coverage, and increased functionality. A wireless communication system may provide communication for a number of cells, each of which may be serviced by a base station. A base station may be a fixed station that communicates with mobile stations.

Various signal processing techniques may be used in wireless communication systems to improve efficiency and quality of wireless communication. One such technique may include using multiple antennas for multiple-input and multiple-output (MIMO) or transmit diversity (TxD). Additional gains may be realized within these channels. Benefits may be realized by providing gains within these control channels while maintaining or increasing reliability and sustaining compatibility with older equipment. Therefore, benefits may be realized by improved coding techniques.

DETAILED DESCRIPTION

Figure 1:
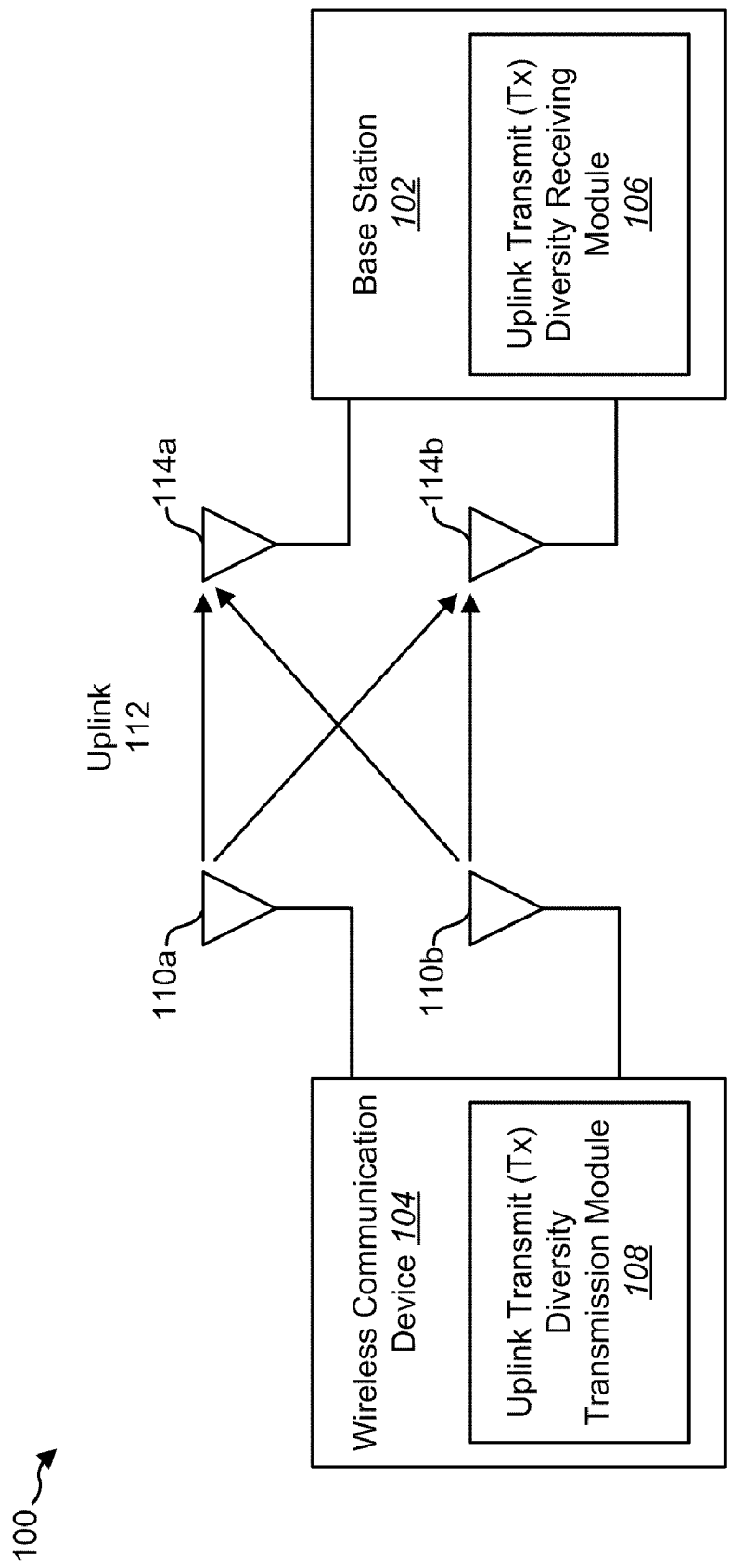
FIG. 1 is a block diagram illustrating a wireless communication system with a wireless communication device and a base station.

A method for transmitting uplink control information (UCI) using a physical uplink control channel (PUCCH) transmit diversity scheme is described. A UCI is coded with a Forward Error Correction code such as a Reed-Muller code to obtain a coded UCI. The coded UCI is mapped to quadrature phase shift keying (QPSK) symbols to obtain a mapped coded UCI. A phase shift is applied to the mapped coded UCI based on an acknowledge/negative-acknowledge (ACK/NACK) to obtain a phase shifted mapped coded UCI. The mapped coded UCI is sent using a PUCCH resource on a first antenna. The phase shifted mapped coded UCI is sent using a PUCCH resource on a second antenna.

The UCI may include a channel quality indicator (CQI), a precoding matrix index (PMI) and the ACK/NACK. The CQI, PMI and ACK/NACK may be concatenated to obtain a concatenated UCI. Coding the UCI with a Forward Error Correction code, such as a Reed-Muller code may include joint coding the concatenated UCI. The ACK/NACK may be coded on reference symbols of the PUCCH resource of the first antenna to obtain a first set of ACK/NACK coded reference symbols. The first set of ACK/NACK coded reference symbols may be combined with the mapped coded UCI prior to sending the mapped coded UCI.

The ACK/NACK may be coded on reference symbols of the PUCCH resource of the second antenna to obtain a second set of ACK/NACK coded reference symbols. The second set of ACK/NACK coded reference symbols may be combined with the phase shifted mapped coded UCI prior to sending the phase shifted mapped coded UCI. The coded UCI may be twenty bits. The coded UCI may be mapped to ten QPSK symbols. The method may be performed by a wireless communication device. The wireless communication device may be configured to operate using a single or multiple antennas. The UCI may be transmitted using PUCCH format 2. The UCI may also be transmitted using PUCCH format 2a/2b.

A method for receiving uplink control information (UCI) using a physical uplink control channel (PUCCH) transmit diversity scheme is described. A first set of symbols is received by a first signal receiver for a first PUCCH transmission. A second set of symbols is received by a second signal receiver for a second PUCCH transmission. A first acknowledge/negative-acknowledge (ACK/NACK) estimate is estimated. A phase shift is removed from the second set of symbols based on the first ACK/NACK estimate to obtain a third set of symbols. The first set of symbols is combined with the third set of symbols to obtain a fourth set of symbols. The fourth set of symbols is decoded to obtain the UCI.

A differential phase shift between the first set of symbols and the second set of symbols may be computed. The first ACK/NACK estimate may be based on the differential phase shift. A second ACK/NACK estimate may be extracted from one or more reference symbols in the first set of symbols and the second set of symbols. A third ACK/NACK estimate may be a combination of the first ACK/NACK estimate and the second ACK/NACK estimate. The method may be performed by a base station configured to operate using a single or multiple antennas. Decoding may be performed using a Reed-Muller decoder, in the case where a Reed-Muller code was used to encode the UCI. The UCI may be sent using PUCCH format 2a/2b as per 3GPP TS 36.211.

A method for receiving uplink control information (UCI) using a physical uplink control channel (PUCCH) transmit diversity scheme is disclosed. A first set of symbols is received by a first signal receiver for a first PUCCH transmission. A second set of symbols is received by a second signal receiver for a second PUCCH transmission. A differential phase shift between the first set of symbols and the second set of symbols is computed. A first acknowledge/negative-acknowledge (ACK/NACK) estimate is estimated based on the differential phase shift. A phase shift is removed from the second set of symbols based on the first ACK/NACK estimate to obtain a third set of symbols. The first set of symbols is combined with the third set of symbols to obtain a fourth set of symbols. The fourth set of symbols is decoded to obtain a first UCI that includes a joint decoded ACK/NACK estimate.

It may be determined whether the first ACK/NACK estimate and the joint decoded ACK/NACK estimate differ by less than a threshold. The joint decoded ACK/NACK estimate may be selected as the ACK/NACK if the first ACK/NACK estimate and the joint decoded ACK/NACK estimate differ by less than a threshold. The first set of symbols may be decoded to obtain a second ACK/NACK estimate if the first ACK/NACK estimate and the joint decoded ACK/NACK estimate differ by more than a threshold.

The first ACK/NACK estimate and the second ACK/NACK estimate may be combined to obtain a third ACK/NACK estimate. A phase shift may be removed from the second set of symbols based on the third ACK/NACK estimate to obtain a fifth set of symbols. The fifth set of symbols may be combined with the first set of symbols to obtain a sixth set of symbols. The sixth set of symbols may be decoded to obtain a second UCI that includes a joint decoded fourth ACK/NACK estimate. It may be determined whether the third ACK/NACK estimate and the joint decoded fourth ACK/NACK estimate differ by less than a threshold. The joint decoded ACK/NACK estimate may be selected as the ACK/NACK if the third ACK/NACK estimate and the joint decoded fourth ACK/NACK estimate differ by less than a threshold. A fifth ACK/NACK estimate may be determined based on the first ACK/NACK estimate if the third ACK/NACK estimate and the joint decoded fourth ACK/NACK estimate differ by more than a threshold.

A phase shift may be removed from the second set of symbols based on the fifth ACK/NACK estimate to obtain a seventh set of symbols. The seventh set of symbols may be combined with the first set of symbols to obtain an eighth set of symbols. The eighth set of symbols may be decoded to obtain a third UCI that includes a joint decoded sixth ACK/NACK estimate. It may be determined whether the fifth ACK/NACK estimate and the joint decoded sixth ACK/NACK estimate differ by less than a threshold. The joint decoded sixth ACK/NACK estimate may be selected as the ACK/NACK if the fifth ACK/NACK estimate and the joint decoded sixth ACK/NACK estimate differ by less than a threshold. The ACK/NACK may be determined based on the number of bits in the third UCI if the fifth ACK/NACK estimate and the joint decoded sixth ACK/NACK estimate differ by more than a threshold.

The method may be performed by a base station configured to operate using a single or multiple antennas. Decoding may be performed using a Reed-Muller decoder for cases where a Reed-Muller code was used to encode the UCI. The UCI may be sent using PUCCH format 2 as per 3GPP TS 36.211.

A wireless communication device configured for transmitting uplink control information (UCI) using a physical uplink control channel (PUCCH) transmit diversity scheme is described. The wireless communication device includes a Reed-Muller encoder, a quadrature phase shift keying (QPSK) symbol mapper, a phase shifter, a first antenna, and a second antenna.

The Reed-Muller encoder may joint code a channel quality indicator (CQI)/precoding matrix index (PMI) and an acknowledge/negative-acknowledge (ACK/NACK). The wireless communication device may also include a first ACK/NACK reference symbol coder and a second ACK/NACK reference symbol coder. An ACK/NACK reference symbol coder may code an ACK/NACK onto one or more reference symbols of a slot. The phase shifter may apply a phase shift based on the ACK/NACK. The wireless communication device may be configured to operate using single or multiple antennas. The UCI may be transmitted using PUCCH format 2. The UCI may be transmitted using PUCCH format 2a/2b.

A base station configured for receiving uplink control information (UCI) using a physical uplink control channel (PUCCH) transmit diversity scheme is also described. The base station includes a first signal receiver for a first PUCCH transmission that receives a first set of symbols. The base station also includes a second signal receiver for a second PUCCH transmission that receives a second set of symbols. The base station further includes a differential phase shift computer that computes the differential phase shift between the first set of symbols and the second set of symbols. The base station also includes a phase shift estimation module that estimates a first acknowledge/negative-acknowledge (ACK/NACK) estimate based on the differential phase shift. The base station further includes a phase shift removal module that removes a phase shift from the second set of symbols to obtain a third set of symbols. The base station also includes a first combiner that combines the first set of symbols and the third set of symbols to obtain a fourth set of symbols. The base station also includes a first decoder that decodes the fourth set of symbols to obtain the UCI.

The base station may also include an ACK/NACK extraction module that extracts a second ACK/NACK estimate from one or more reference symbols of the first set of symbols and the second set of symbols. The base station may further include a second combiner that combines the first ACK/NACK estimate and the second ACK/NACK estimate to obtain a third ACK/NACK estimate. The phase shift removed from the second set of symbols may be based on the third ACK/NACK estimate.

The base station may include a second decoder that decodes a second ACK/NACK estimate from the first set of symbols. The base station may also include a second combiner that combines the first ACK/NACK estimate and the second ACK/NACK estimate to obtain a third ACK/NACK estimate. The UCI output by the first decoder may include a channel quality indicator (CQI), a precoding matrix index (PMI) and a fourth ACK/NACK estimate. The base station may further include a validation module that determines the validity of the fourth ACK/NACK estimate.

FIG. 1 is a block diagram illustrating a wireless communication system 100 with a wireless communication device 104 and a base station 102. A base station 102 may be in wireless communication with one or more wireless communication devices 104. A base station 102 may be referred to as an access point, a Node B, an eNodeB, or some other terminology. Likewise, a wireless communication device 104 may be referred to as a mobile station, a subscriber station, an access terminal, a remote station, a user terminal, a terminal, a handset, a subscriber unit, user equipment, or some other terminology. The wireless communication device may transmit data to the base station over a radio frequency (RF) communication channel.

A wireless communication device 104 may communicate with zero, one or multiple base stations 102 on the downlink and/or uplink 112 at any given moment. The downlink refers to the communication link from a base station 102 to a wireless communication device 104. The uplink 112 refers to the communication link from a wireless communication device 104 to a base station 102.

Communication between a wireless communication device 104 and a base station 102 may be accomplished using transmissions over a wireless link including an uplink 112 and a downlink. The communication link may be established using a single-input and single-output (SISO), multiple-input and single-output (MISO) or a multiple-input and multiple-output (MIMO) system. A MIMO system may include both a transmitter and a receiver equipped with multiple transmit and receive antennas. A MIMO system may provide improved performance if the additional dimensionalities created by the multiple transmit and receive antennas are utilized.

The use of multiple antennas 110a-b on the wireless communication device 104 may allow transmit diversity on the uplink 112. In transmit diversity, signals originating from the two or more independent sources that have been modulated with identical information-bearing signals may be used. Transmit diversity may help overcome the effects of fading, outages, and circuit failures.

In 3$^{rd}$ Generation Partnership Project (3GPP) Long Term Evolution (LTE)-Advanced, additional control feedback will have to be sent on control channels to accommodate MIMO and carrier aggregation (CA). Carrier aggregation refers to transmitting data on multiple sub-bands which are contiguously located. Both the acknowledge/negative-acknowledge (ACK/NACK) bits and other control information may be transmitted using the PUCCH. A transmit diversity format for the PUCCH may significantly enhance the ACK/NACK performance while maintaining the diversity gain on other uplink control information (UCI). The other UCI may include the channel quality indicator (CQI) and the precoding matrix index (PMI). In other words, by using a transmit diversity format for the PUCCH, the reliability of the transmission of the ACK/NACK bits on the uplink may be improved while maintaining the reliability of the transmission of other control information on the uplink.

In current LTE release-8 specifications, only one antenna is used. With LTE-Advanced, a wireless communication device 104 may have multiple antennas 110. Typically, a wireless communication device 104 may use two or four antennas 110, although other quantities of antennas 110 may be used. Transmit diversity schemes with multiple antennas 110 are being considered and are in the discussion phase.

Transmit diversity methods are studied separately for PUCCH and PUSCH. In the recent 3GPP meetings, it was agreed that for PUCCH, uplink single antenna port mode should be supported even with multiple antennas 110. It was also agreed that spatial orthogonal resource transmit diversity (SORTD) may be applied for a multiple resource PUCCH. The PUCCH may use one of six formats for transmission: format 1/1a/1b or format 2/2a/2b. For format 1/1a/1b, it was agreed that the same modulated symbols are transmitted on different orthogonal resources for different antennas 110. The PUCCH formats 2/2a/2b were left for future study. With SORTD, separate orthogonal resources may be allocated for the PUCCH. The structure of the PUCCH of each resource should be the same as release 8 to ensure backward compatibility. The PUCCH transmit diversity scheme may introduce another level of protection for ACK/NACK bits when transmit diversity is used.

Solutions for using the formats 2/2a/2b include simple repetition and joint coding. In simple repetition, a wireless communication device 104 may transmit the same modulated symbols on different orthogonal resources for different antennas 110. Simple repetition has backward compatibility and is consistent with formats 1/1a/1b. In joint coding, a longer sequence of codewords is used and part of the codeword is transmitted on each antenna 110. Joint coding achieves a coding gain but no diversity gain. Moreover, joint coding loses the backward compatibility of single antenna transmission. Joint coding is also vulnerable to antenna gain imbalance (AGI).

Existing transmit diversity proposals assume the same coding method for all uplink channel information (UCI) including ACK/NACK, channel quality indicator (CQI) and precoding matrix index (PMI). However, ACK/NACK requires a higher error protection than other information bits (such as CQI and PMI) during system operation. By using a combination of simple repetition and joint coding, the backward compatibility may be retained while introducing an enhancement on the more important messages such as ACK/NACK.

The target PUCCH performance qualities are given in Table 1 below according to 3GPP TS 36.300.

TABLE 1

| Event | Target Quality |
| --- | --- |
| ACK miss detection (for DL-SCH) | ($10^{-2}$) |
| DTX to ACK error (for DL-SCH) | ($10^{-2}$-$10^{-1}$) |
| NACK to ACK error (for DL-SCH) | ($10^{-4}$-$10^{-3}$) |
| CQI block error rate | FFS ($10^{-2}$-$10^{-1}$) |

As shown in Table 1, the ACK/NACK in general requires a higher reliability than the CQI. This is because the CQI is concerned with the block error rate and the ACK/NACK is concerned with the bit error rate. The NACK to ACK error should have better protection than the ACK to NACK miss detection.

The existing PUCCH formats cannot fully satisfy these requirements. Because ACK/NACK bits are treated equally, the NACK to ACK and ACK to NACK performances are also the same. Furthermore, with the existing schemes, the ACK/NACK performance is not sufficient. The use of carrier aggregation (CA) in LTE-A may require ACK/NACK bundling in PUCCH feedback. Thus, improvements in ACK/NACK performance may be desirable.

The current Release 8 PUCCH formats may not provide enough protection on the ACK/NACK. The existing PUCCH formats may be especially unable to achieve the NACK to ACK error probability. In PUCCH transmit diversity design, the unequal error protection for different types of control feedback may be considered. It is desirable to find new formats that can further differentiate the performance of ACK/NACK from other control bits, such as the CQI and the PMI.

In format 2, the ACK/NACK and the CQI/PMI are jointly coded. Thus, the ACK/NACK and the CQI/PMI have the same bit error rate (BER) performance. As the number of control bits increases, the ACK/NACK and CQI/PMI performance may degrade. Thus, the ACK/NACK may not get enough protection compared to the CQI/PMI. Also, the ACK/NACK performance degrades with the increase of CQI/PMI bits.

With normal cyclic prefix (CP) in format 2a and 2b, the ACK/NACK bits are transmitted on the four reference symbols with differential binary phase-shift keying (BPSK) and differential quadrature phase-shift keying (QPSK) respectively, i.e. the ACK/NACK bits are coded on the second reference symbol by a differential phase shift over the first reference symbol. Thus, the ACK/NACK is independent of other control bits with a simple 2× (two times) differential coding repetition redundancy. The CQI/PMI bits are coded independently to twenty bits. Thus, the CQI/PMI may have a Reed-Muller (RM) code gain with a coding rate between 1/5 and 11/20. Differential coding may have worse performance when compared with non-differential coding, e.g. QPSK performance is ~3 dB worse than normal QPSK. Therefore, with format 2a/2b, the ACK/NACK performance may be worse than the CQI in most cases.

The wireless communication device 104 may send uplink 112 transmissions using either two antennas 110 or four antennas 110. When four antennas 110 are used by the wireless communication device 104, the four antennas 110 may be formed into two virtual antennas. Then, the same scheme used by two antennas 110 may be used by the two virtual antennas. The base station 102 may receive the uplink 112 transmissions using multiple antennas, e.g. two antennas 114a-b, four antennas or eight antennas.

The wireless communication device 104 may include an uplink transmit (Tx) diversity transmission module 108. The uplink transmit (Tx) diversity transmission module 108 may facilitate the transmission of uplink control information (UCI) from the wireless communication device 104 on the uplink 112 using multiple antennas 110. For example, the uplink transmit (Tx) diversity transmission module 108 may select the format of the uplink 112 transmissions and apply format specific coding/mapping. The base station 102 may include an uplink transmit (Tx) diversity receiving module 106. The uplink transmit (Tx) diversity receiving module 106 may facilitate the receiving of UCI on the uplink 112 using multiple antennas 114. For example, the uplink transmit (Tx) diversity receiving module 106 may determine the format of a received UCI on the uplink 112 and apply techniques to improve performance of the uplink 112 transmission.

By differentiating the ACK/NACK from other control information, the bit error rate of ACK/NACK bits may be reduced. Thus, packet loss due to miss detection of NACK to ACK may be prevented. Furthermore, unnecessary retransmission from miss detection of ACK to NACK may be reduced. The full diversity gain of repetition on different antennas with SORTD may be maintained with negligible impact from ACK/NACK residue.

Figure 2:
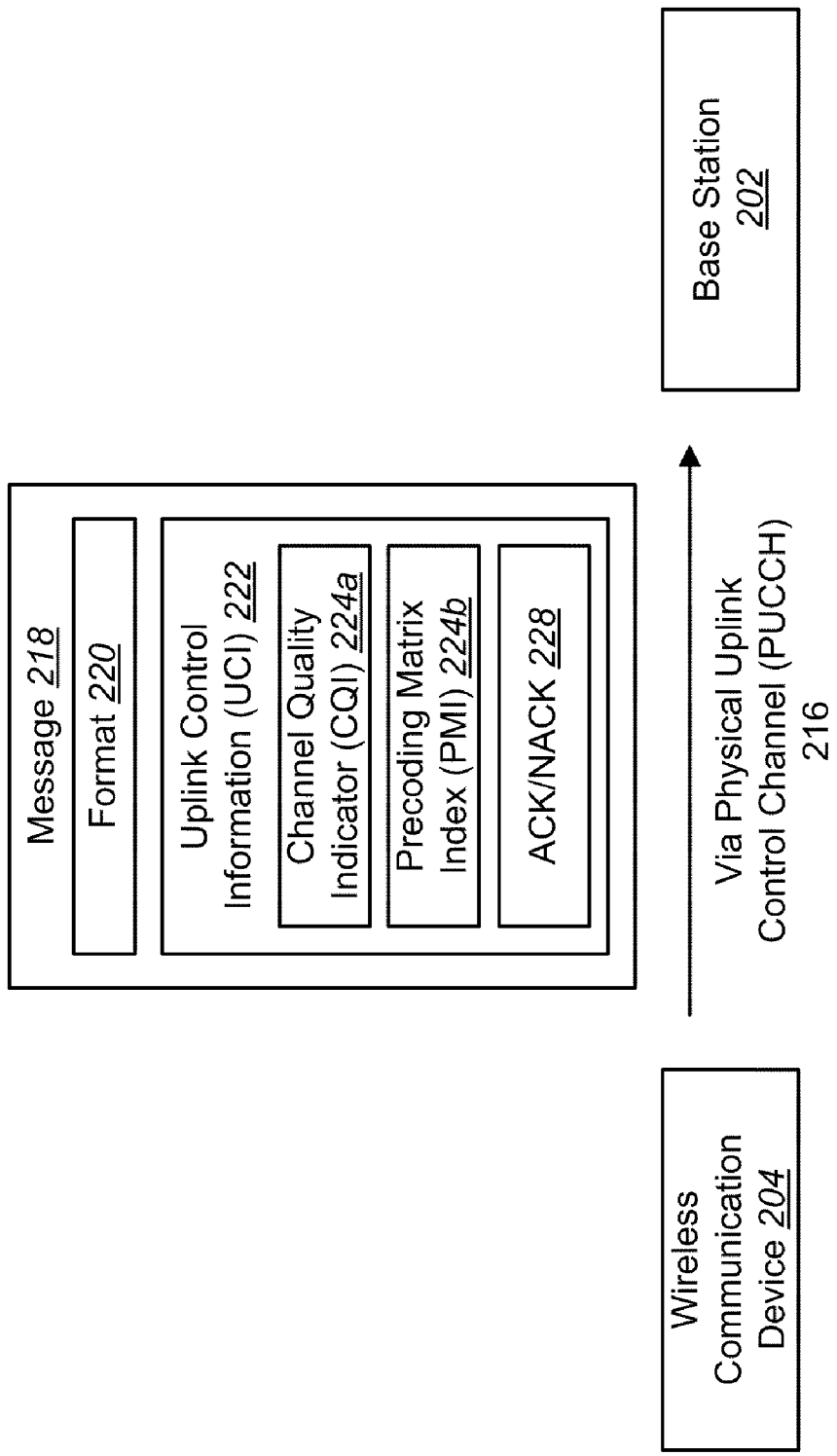
FIG. 2 is a block diagram illustrating the transmission of a message from a wireless communication device to a base station via the physical uplink control channel (PUCCH)

FIG. 2 is a block diagram illustrating the transmission of a message 218 from a wireless communication device 204 to a base station 202 via the physical uplink control channel (PUCCH) 216. The wireless communication device 204 of FIG. 2 may be one configuration of the wireless communication device 104 of FIG. 1. Likewise, the base station 202 of FIG. 2 may be one configuration of the base station 102 of FIG. 1. The wireless communication device 204 may transmit the message 218 via the physical uplink control channel (PUCCH) 216 to the base station 202.

The message 218 may include uplink control information (UCI) 222. The UCI 222 may include a channel quality indicator (CQI) 224a and/or a precoding matrix index (PMI) 224b. The message 218 may also include ACK/NACK 228 information. The message 218 may further include a format 220 for which the message was transmitted. For example, the message 218 may be transmitted using format 1/1a/1b or format 2/2a/2b.

In Release 8, the formats 220 and coding for the PUCCH 216 are defined as illustrated in Table 2.

TABLE 2

| PUCCH format | Modulation scheme | Number of bits per subframe, $M_{bit}$ | CQI/PMI etc. | ACK/NACK |
|---|---|---|---|---|
| 1 | N/A | N/A | N/A | 1 |
| 1a | BPSK | 1 | N/A | 1 |
| 1b | QPSK | 2 | N/A | 2 |
| 2 | QPSK | 20 | 4-11 | 0-2 |
| 2a | QPSK + BPSK | 21 | 4-11 | 1-2 |
| 2b | QPSK + QPSK | 22 | 4-11 | 1-2 |

Release 8 supports only single antenna transmission on the uplink. For format 1, information is carried by the presence/absence of the transmission of the PUCCH 216 from the wireless communication device 204. For format 1a and 1b, one or two explicit bits are transmitted with binary phase-shift keying (BPSK) and quadrature phase-shift keying (QPSK) modulation respectively.

For format 2, the uplink control information (UCI) 222 such as the channel quality indicator (CQI) 224a and the precoding matrix index (PMI) 224b along with the ACK/NACK 228 may be concatenated and joint coded with a Forward Error Correction (FEC) code such as a Reed-Muller (RM) (20, O) code to twenty bits. With extended cyclic prefix (CP), only format 2 may be used. Formats 2a and 2b are the default formats for normal CP. With format 2a/2b, the UCI 222 may be coded with an RM code to twenty bits and transmitted on PUCCH 216 symbols while the ACK/NACK 228 bits may be coded and transmitted on the PUCCH 216 reference symbols (RS).

A PUCCH resource is allocated within a subframe, which consists of two slots. With normal CP, each slot has seven symbols. Two of the symbols are used as reference symbols and five are used for the PUCCH 216 message. Thus, with normal CP, the PUCCH 216 has ten message carrying symbols and four reference symbols. With format 2a/2b, four reference symbols may be used for the ACK/NACK 228 and the other ten symbols may be used for the other UCI 222. The ACK/NACK 228 may be coded with a differential phase-shift coded on the second reference symbol with the first reference symbol as a phase reference.

With extended CP, each slot has six symbols. One of the symbols may be used as a reference symbol and the five other symbols may be used for the PUCCH 216 message. Thus, the PUCCH 216 has ten message carrying symbols and two reference symbols. Because there is only one reference symbol in each slot, ACK/NACK coding is not possible with extended CP. Therefore, with format 2, the ACK/NACK 228 may be joint coded with the other UCI 222 (such as the CQI 224a and the PMI 224b) and transmitted in the ten message carrying symbols. The block of complex-valued symbols z(i) may be multiplied with the amplitude scaling factor $\beta_{PUCCH}$ in order to conform to the transmit power. The block of complex-valued symbols may then be mapped in sequence starting with z(0) to the resource elements.

A wireless communication device 204 with multiple transmit antennas 110 may be required to behave as wireless communication devices with a single antenna port from a base station's 202 perspective in Uplink Single Antenna Port Mode. The PUCCH 216, PUCCH or SRS transmission may be configured to enter Uplink Single Antenna Port Mode. Alternatively, the wireless communication device 204 may enter the Uplink Single Antenna Port Mode without instruction from the base station 202 in some scenarios.

SORTD may be the baseline for a PUCCH 216 transmit diversity scheme. Multiple resources may be allocated for each antenna 110 when there are two transmit antennas 110. The virtual antenna concept may be used for scenarios where there are four transmit antennas 110. Backward compatibility is important in PUCCH 216 transmit diversity design. The two options with SORTD are simple repetition and joint coding. In simple repetition, the same coded information may be transmitted on the second antenna 110b as on the first antenna 110a. Simple repetition has diversity gain but no coding gain (or it could be viewed as repetition coding gain). In joint coding, a higher redundancy code may be used, and half of the codeword may be transmitted on each channel. Joint coding has coding gain but no diversity gain. Joint coding supports a larger payload but has no backward compatibility. The splitting of a codeword makes joint coding vulnerable to AGI.

Figure 3:
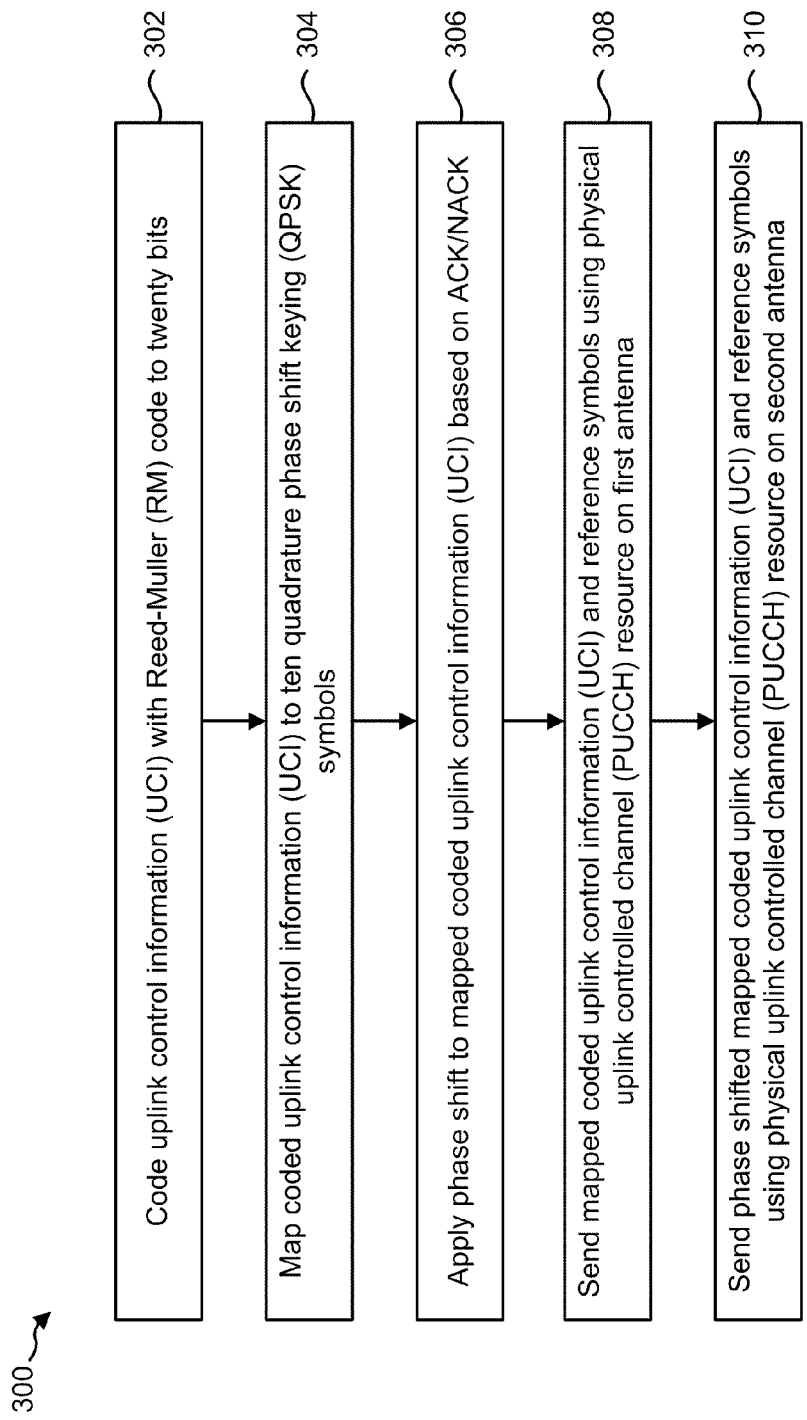
FIG. 3 is a flow diagram of a method for transmitting uplink control information (UCI) using a physical uplink control channel (PUCCH) transmit diversity scheme.

FIG. 3 is a flow diagram of a method 300 for transmitting uplink control information (UCI) 222 using a physical uplink control channel (PUCCH) 216 transmit diversity scheme. The method 300 may be performed by a wireless communication device 104. The method 300 of FIG. 3 may apply to a PUCCH message 218 using format 2, format 2a or format 2b. In one configuration, the wireless communication device 104 may be a UE. The UCI 222 may be part of a PUCCH message 218. In one configuration, the UCI 222 may include a CQI 224a, a PMI 224b and an ACK/NACK 228. The wireless communication device 104 may code 302 a UCI 222 with a Forward Error Correction (FEC) code such as a Reed-Muller code to twenty bits. The wireless communication device 104 may then map 304 the coded UCI 222 to ten QPSK symbols. Alternatively, the wireless communication device 104 may map 304 the coded UCI 222 to a different number of QPSK symbols.

The wireless communication device 104 may apply 306 a phase shift to the mapped coded UCI 224a based on an ACK/NACK 228. The phase shift applied may depend on the format 220 of the PUCCH message 218. The phase shifts applied to the mapped coded UCI 222 for format 2 PUCCH messages 218 with transmit diversity are shown in Table 3.

TABLE 3

| PUCCH format | ACK/NACK bits | Joint coded control bits (CQI + A/N) on $1^{st}$ antenna $b(0), \ldots, b(19)$ | Phase shift on $2^{nd}$ antenna for $b(0), \ldots, b(19)$ |
|---|---|---|---|
| 2 | 0 | Same as Release-8 | 0 |
|   | 1 | Same as Release-8 | $\pi$ |
|   | 00 | Same as Release-8 | 0 |
|   | 01 | Same as Release-8 | $-\pi/2$ |
|   | 10 | Same as Release-8 | $\pi/2$ |
|   | 11 | Same as Release-8 | $\pi$ |

The joint coded control bits on the first antenna 110a are the same as those used in LTE Release 8. The phase shifts applied to the mapped coded UCI 222 for format 2a/2b PUCCH messages 218 with transmit diversity are shown in Table 4. No phase shift coding is applied on the reference symbols between the two PUCCH transmissions.

TABLE 4

| PUCCH format | ACK/NACK bits on reference symbols $b(20), \ldots, b(M_{bit}-1)$ | Coded control bits (CQI/PMI) $b(0), \ldots, b(19)$ on $1^{st}$ antenna | Phase shift on $2^{nd}$ antenna for $b(0), \ldots, b(19)$ |
|---|---|---|---|
| 2a | 0 | Same as Release-8 | 0 |
|    | 1 | Same as Release-8 | $\pi$ |
| 2b | 00 | Same as Release-8 | 0 |
|    | 01 | Same as Release-8 | $-\pi/2$ |
|    | 10 | Same as Release-8 | $\pi/2$ |
|    | 11 | Same as Release-8 | $\pi$ |

The wireless communication device 104 may then send 308 the mapped coded UCI 224a and reference symbols using a PUCCH resource on a first antenna 110a. The wireless communication device 104 may send 310 the phase shifted mapped coded UCI 222 and reference symbols using a PUCCH resource on a second antenna 110b. The wireless communication device 104 may send 310 the phase shifted mapped coded UCI 222 and reference symbols using the PUCCH resource on the second antenna 110b while concurrently sending 308 the mapped coded UCI 222 and reference symbols using the PUCCH resource on the first antenna 110a. The ACK/NACK may be coded on the reference symbols in the same manner as in release-8 and no phase shift coding is applied on the reference symbols between the two PUCCH transmissions.

Figure 4:
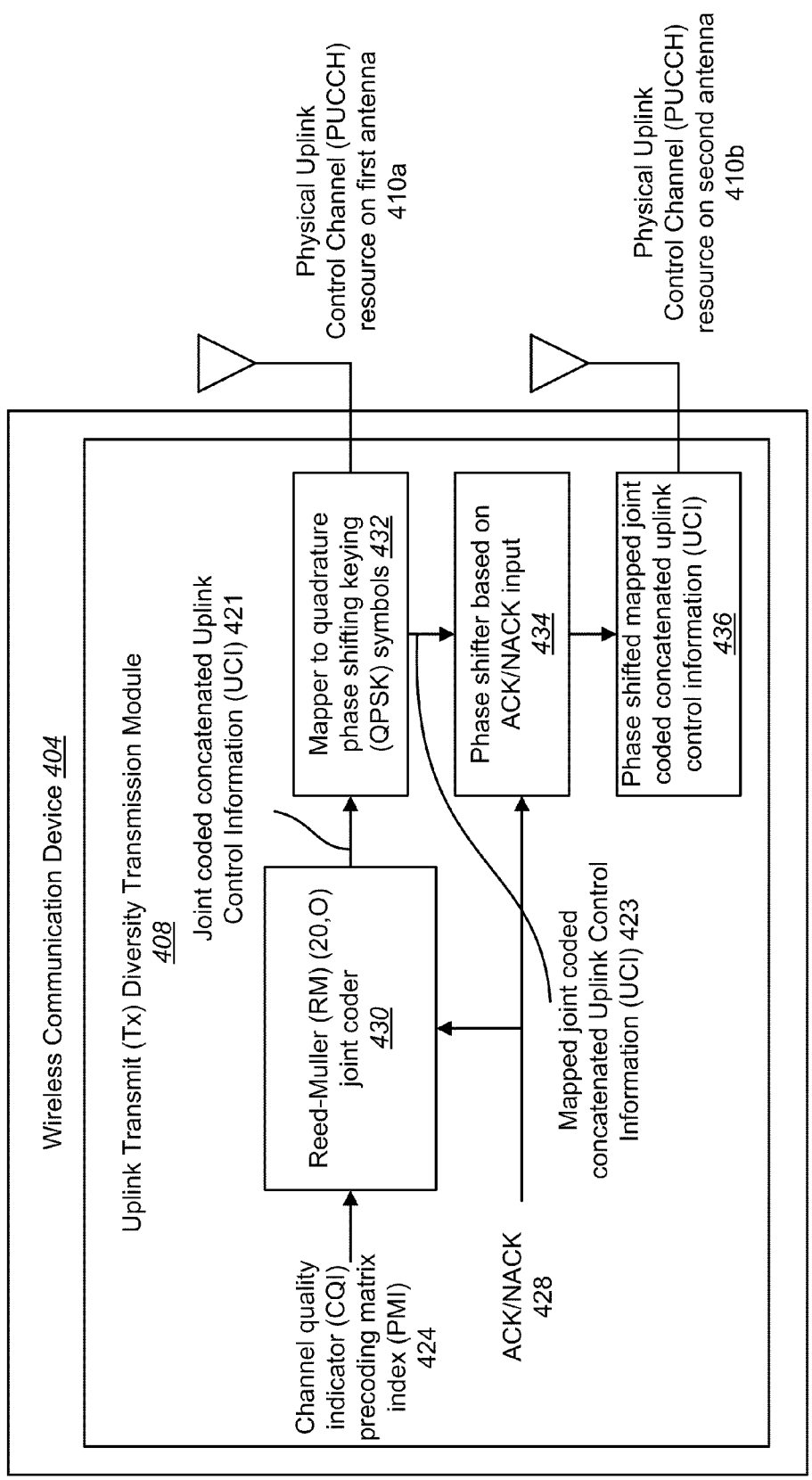
FIG. 4 is a block diagram illustrating data flows for transmitting uplink control information (UCI) using a format 2 PUCCH transmit diversity scheme.

FIG. 4 is a block diagram illustrating data flows for transmitting uplink control information (UCI) 218 using a format 2 PUCCH transmit diversity scheme. A wireless communication device 404 may include an uplink transmit (Tx) diversity transmission module 408. The uplink transmit (Tx) diversity transmission module 408 may include uplink control information (UCI) to be transmitted to a base station 102 via the PUCCH 216. For example, the uplink transmit (Tx) diversity transmission module 408 may include a CQI/PMI 424 and an ACK/NACK 428. A Forward Error Correction (FEC) coder such as a Reed-Muller (20, O) joint coder 430 may code a concatenation of the CQI/PMI 424 and the ACK/NACK 428 to twenty bits. The coder 430 may output a joint coded concatenated UCI 421. The joint coded concatenated UCI 421 may then be mapped to ten QPSK symbols by a mapper 432. The mapper 432 may output a mapped joint coded concatenated UCI 423.

A phase shifter 434 may apply a phase shift to the mapped joint-coded concatenated UCI 423. The phase shift may be based on the ACK/NACK 428 input. The phase shifter 434 may then output a phase shifted mapped joint-coded concatenated UCI 436 mapped to ten QPSK symbols. A PUCCH resource on a first antenna 410a of the wireless communication device 404 may transmit the mapped joint-coded concatenated UCI 423. A PUCCH resource on a second antenna 410b of the wireless communication device 404 may transmit the phase shifted mapped joint-coded concatenated UCI 436.

Figure 5:
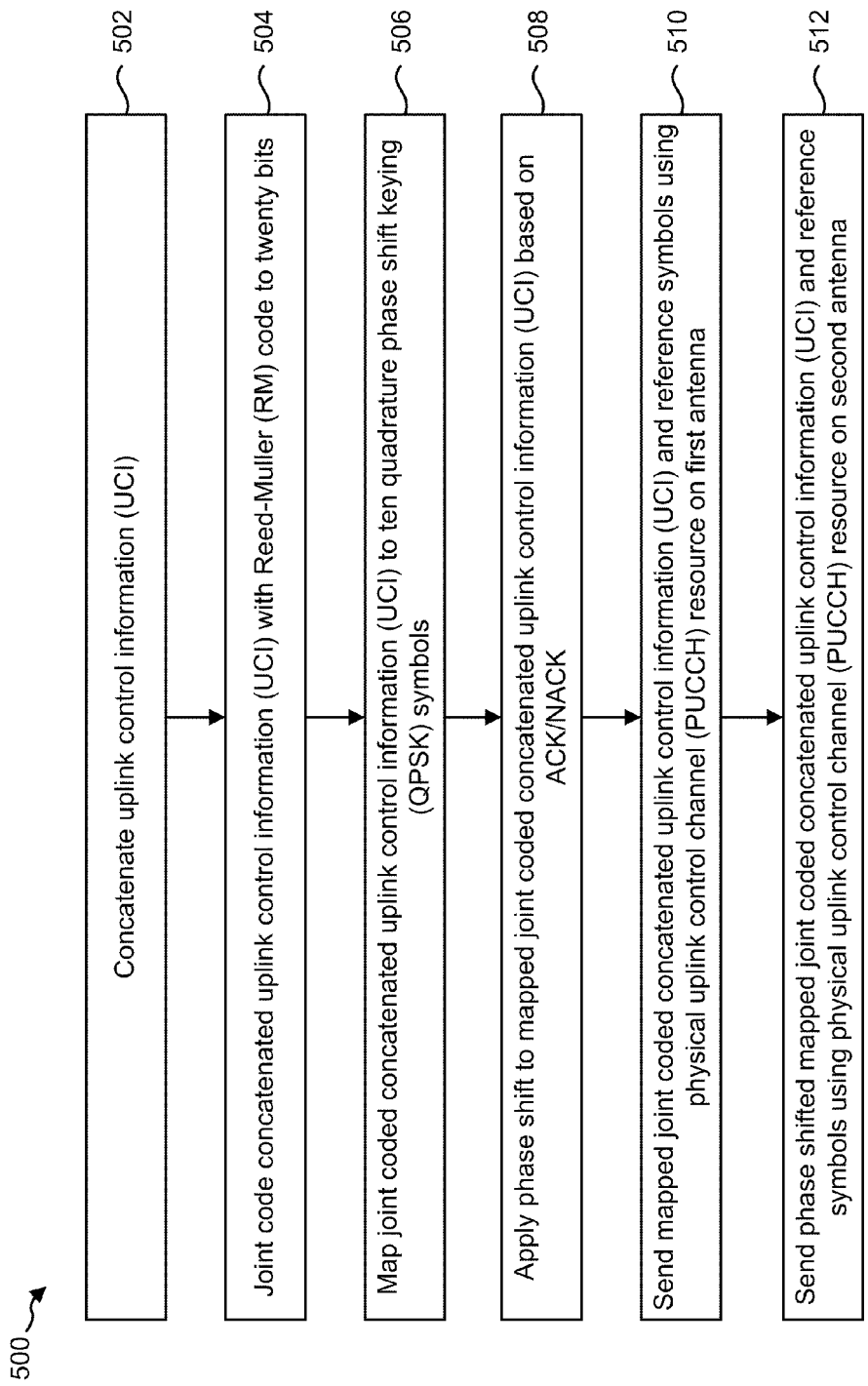
FIG. 5 is a flow diagram of a method for transmitting uplink control information (UCI) using a format 2 PUCCH transmit diversity scheme.

FIG. 5 is a flow diagram of a method 500 for transmitting uplink control information (UCI) using a format 2 PUCCH transmit diversity scheme. The method 500 may be performed by a wireless communication device 404. The wireless 404 device may concatenate 502 uplink control information (UCI). The UCI may include a channel quality indicator (CQI), a precoding matrix index (PMI), and an ACK/NACK 428. The wireless communication device 104 may then joint code 504 the concatenated UCI with a Forward Error Correction (FEC) code such as a Reed-Muller (RM) code to twenty bits to obtain a joint-coded concatenated UCI 421. The wireless communication device 404 may then map 506 the joint-coded concatenated UCI 421 to ten QPSK symbols.

The wireless communication device 404 may apply 508 a phase shift to the mapped joint-coded concatenated UCI 423 based on the ACK/NACK 428. The mapped joint-coded concatenated UCI 423 and PUCCH reference symbols may be sent 510 using a PUCCH resource on a first antenna 410a of the wireless communication device 404. The phase shifted mapped joint-coded concatenated UCI 436 and PUCCH reference symbols may be sent 512 using a PUCCH resource on a second antenna 410b of the wireless communication device 404. The phase shifted mapped joint-coded concatenated UCI 436 and the associated PUCCH reference symbols may be sent 512 at the same time as the mapped joint-coded concatenated UCI 423 and the associated PUCCH reference symbols.

Figure 6:
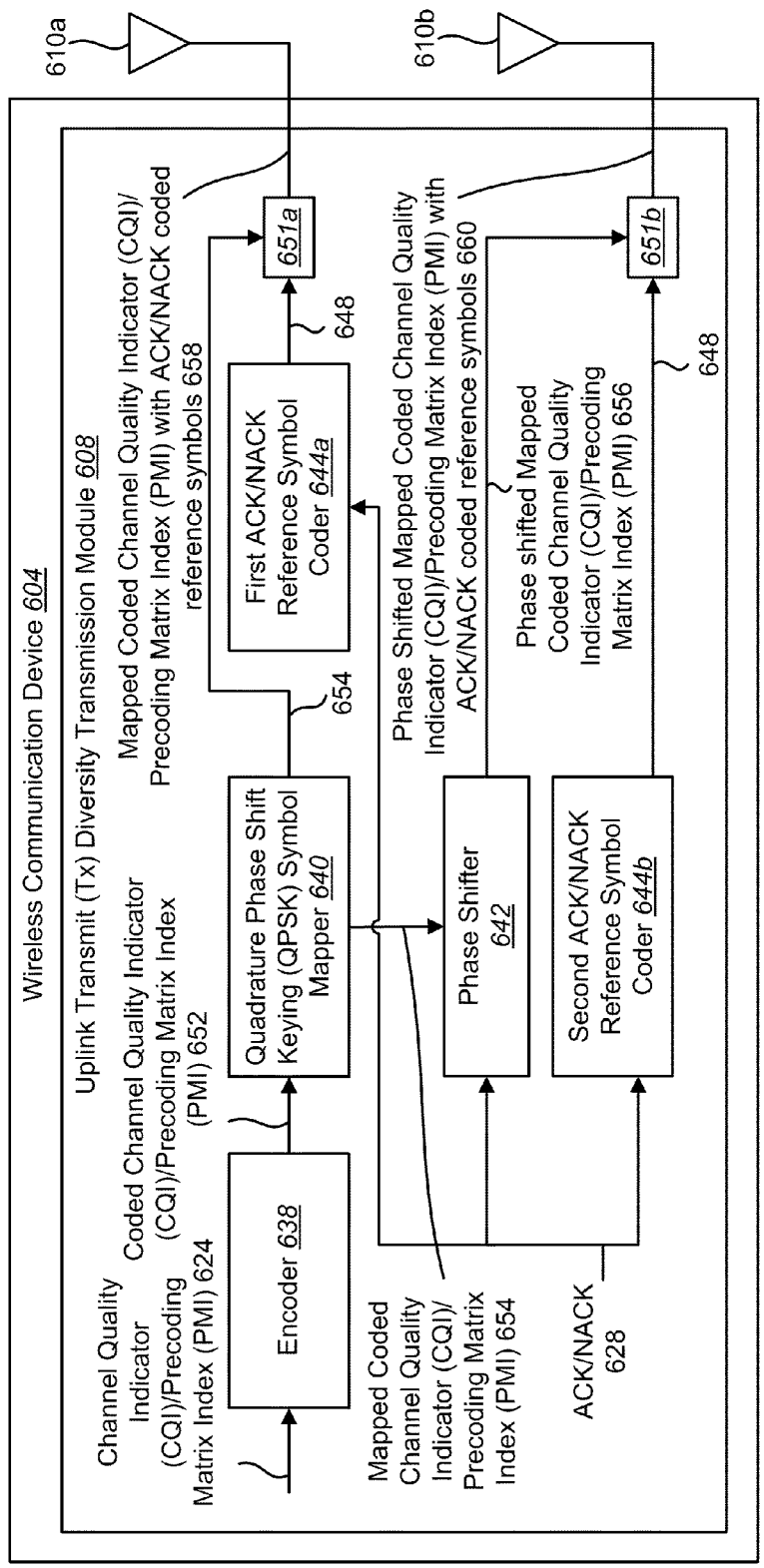
FIG. 6 is a block diagram illustrating data flows for transmitting uplink control information (UCI) using a format 2a/2b PUCCH transmit diversity scheme.

FIG. 6 is a block diagram illustrating data flows for transmitting uplink control information (UCI) using a format 2a/2b PUCCH transmit diversity scheme. A wireless communication device 604 may include an uplink transmit (Tx) diversity transmission module 608. The uplink transmit (Tx) diversity transmission module 608 of FIG. 6 may be one configuration of the uplink transmit (Tx) diversity transmission module 108 of FIG. 1. The uplink transmit (Tx) diversity transmission module 608 may include uplink control information (UCI). The uplink control information (UCI) may include a channel quality indicator (CQI)/precoding matrix index (PMI) 624 and an ACK/NACK 628.

An encoder 638 may receive the CQI/PMI 624. In one configuration, the encoder 638 may be a Forward Error Correction (FEC) coder such as a Reed-Muller (20, O) coder. The encoder 638 may output a coded CQI/PMI 652. The coded CQI/PMI 652 may then be input into a quadrature phase shift keying (QPSK) symbol mapper 640. The QPSK symbol mapper 640 may map the coded CQI/PMI 652 to ten QPSK symbols. The QPSK symbol mapper 640 may output a mapped coded CQI/PMI 654.

In one configuration, the mapped coded CQI/PMI 658 may be transmitted on one allocated PUCCH resource. Each format 2a/2b PUCCH resource may include two slots 646a-b with seven symbols. In each slot 646a-b, two of the symbols may be reference symbols 648a-b and five of the symbols may be QPSK mapped symbols 650a-b. A first ACK/NACK reference symbols coder 644a may code the ACK/NACK 628 to create reference symbols with coded ACK/NACK 648. The reference symbols with coded ACK/NACK 648 may be coded the same way for the first slot 646a and the second slot 646b. The mapped coded CQI/PMI 654 may then be multiplexed with the reference symbols with coded ACK/NACK 648 into a mapped coded CQI/PMI with ACK/NACK coded reference symbols 658 using a first multiplexer 651a.

A phase shifter 642 may also receive the mapped coded CQI/PMI 654. The phase shifter 642 may also receive the ACK/NACK 628. Based on the ACK/NACK 628, the phase shifter 642 may apply a phase shift to the mapped coded CQI/PMI 654. The applied phase shift was discussed above in relation to Table 4. The phase shifter 642 may output a phase shifted mapped coded CQI/PMI 656. A second ACK/NACK reference symbol coder 644b may receive the ACK/NACK 628. The second ACK/NACK reference symbol coder 644b may code the ACK/NACK 628 to create reference symbols with coded ACK/NACK 648. The phase shifted mapped coded CQI/PMI 656 may then be multiplexed with the reference symbols with coded ACK/NACK 648 into a phase shifted mapped coded CQI/PMI with ACK/NACK coded reference symbols 658 using a second multiplexer 651b.

The mapped coded CQI/PMI with ACK/NACK coded reference symbols 658 may be sent using a PUCCH resource (i.e. the two slots 646a-b) on a first antenna 610a of the wireless communication device 604. The phase shifted mapped coded CQI/PMI with ACK/NACK coded reference symbols 660 may be sent using a PUCCH resource on a second antenna 610b of the wireless communication device 604. The phase shifted mapped coded CQI/PMI with ACK/NACK coded reference symbols 660 may be sent at the same time as the mapped coded CQI/PMI with ACK/NACK coded reference symbols 658.

Figure 7:
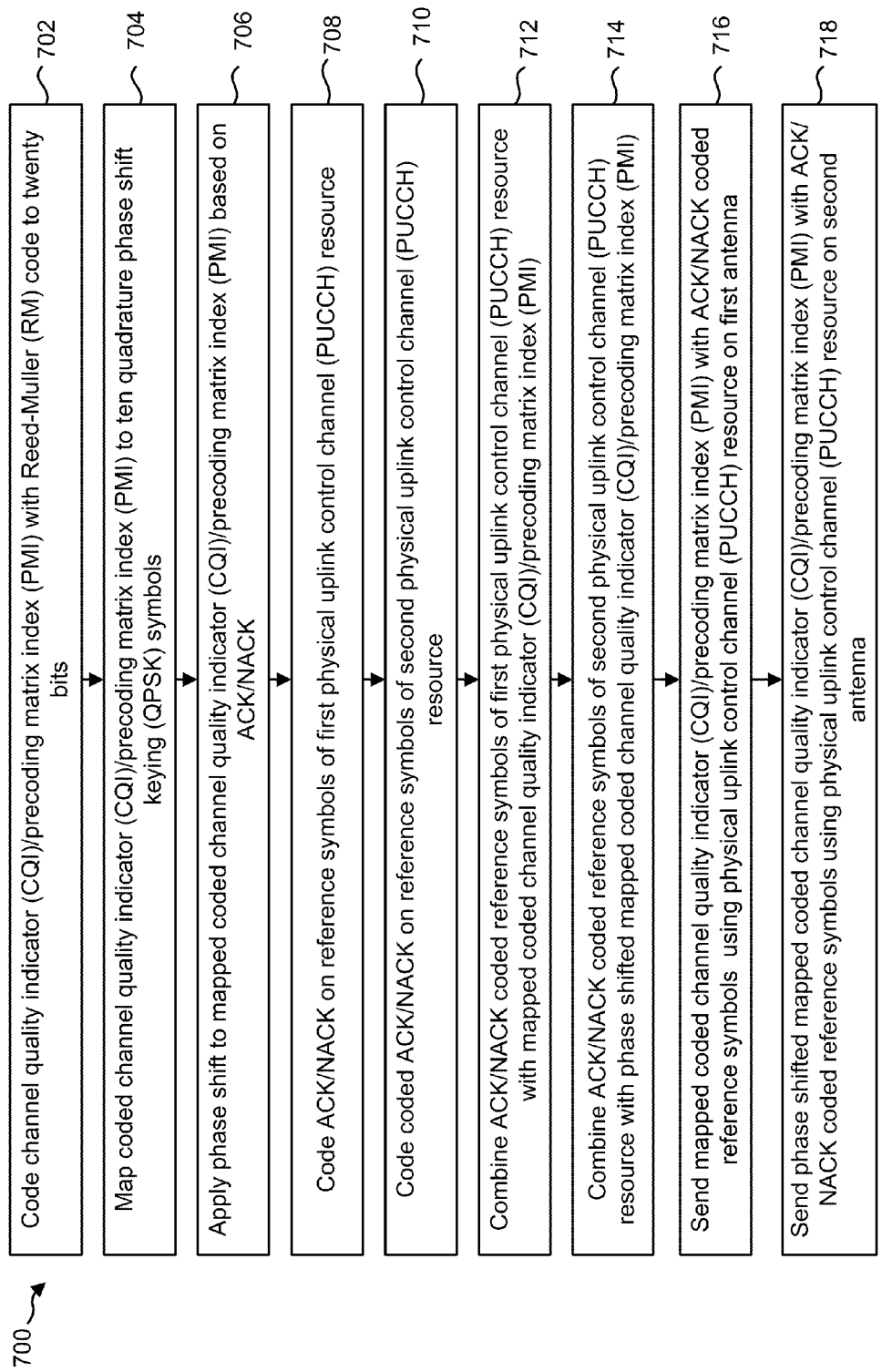
FIG. 7 is a flow diagram of a method for transmitting uplink control information (UCI) using a format 2a/2b PUCCH transmit diversity scheme.

FIG. 7 is a flow diagram of a method 700 for transmitting uplink control information (UCI) 222 using a format 2a/2b PUCCH transmit diversity scheme. The method 700 may be performed by a wireless communication device 604. The wireless communication device 604 may code 702 a channel quality indicator (CQI)/precoding matrix index (PMI) 624 with a Forward Error Correction (FEC) code such as a Reed-Muller (RM) code to twenty bits. The wireless communication device 604 may then map 704 the coded CQI/PMI 652 to ten QPSK symbols. The wireless communication device 604 may next apply 706 a phase shift to the mapped coded CQI/PMI 654. The phase shift may be based on the ACK/NACK 628.

The wireless communication device 604 may code 708 the ACK/NACK 628 on the reference symbols 648a of a first physical uplink control channel (PUCCH) resource for the mapped coded CQI/PMI 654. The wireless communication device 604 may also code 710 the ACK/NACK 628 on the reference symbols 648 of a second PUCCH resource for the phase shifted mapped coded CQI/PMI 656. The wireless communication device 604 may then combine 712 the coded ACK/NACK on the reference symbols 648 of the first PUCCH antenna 610a with the mapped coded channel quality indicator (CQI)/precoding matrix index (PMI) 658. The wireless communication device 604 may also combine 714 the coded ACK/NACK on the reference symbols 648 of the second PUCCH antenna 610b with the phase shifted mapped coded channel quality indicator (CQI)/precoding matrix index (PMI) 656. The wireless communication device 604 may then send 716 the mapped coded CQI/PMI with ACK/NACK coded reference symbols 658 using a PUCCH resource on a first antenna 610a of the wireless communication device 604. The wireless communication device 604 may also send 718 the phase shifted mapped coded CQI/PMI with ACK/NACK coded reference symbols 660 using a PUCCH resource on a second antenna 610b of the wireless communication device 604.

Figure 8:
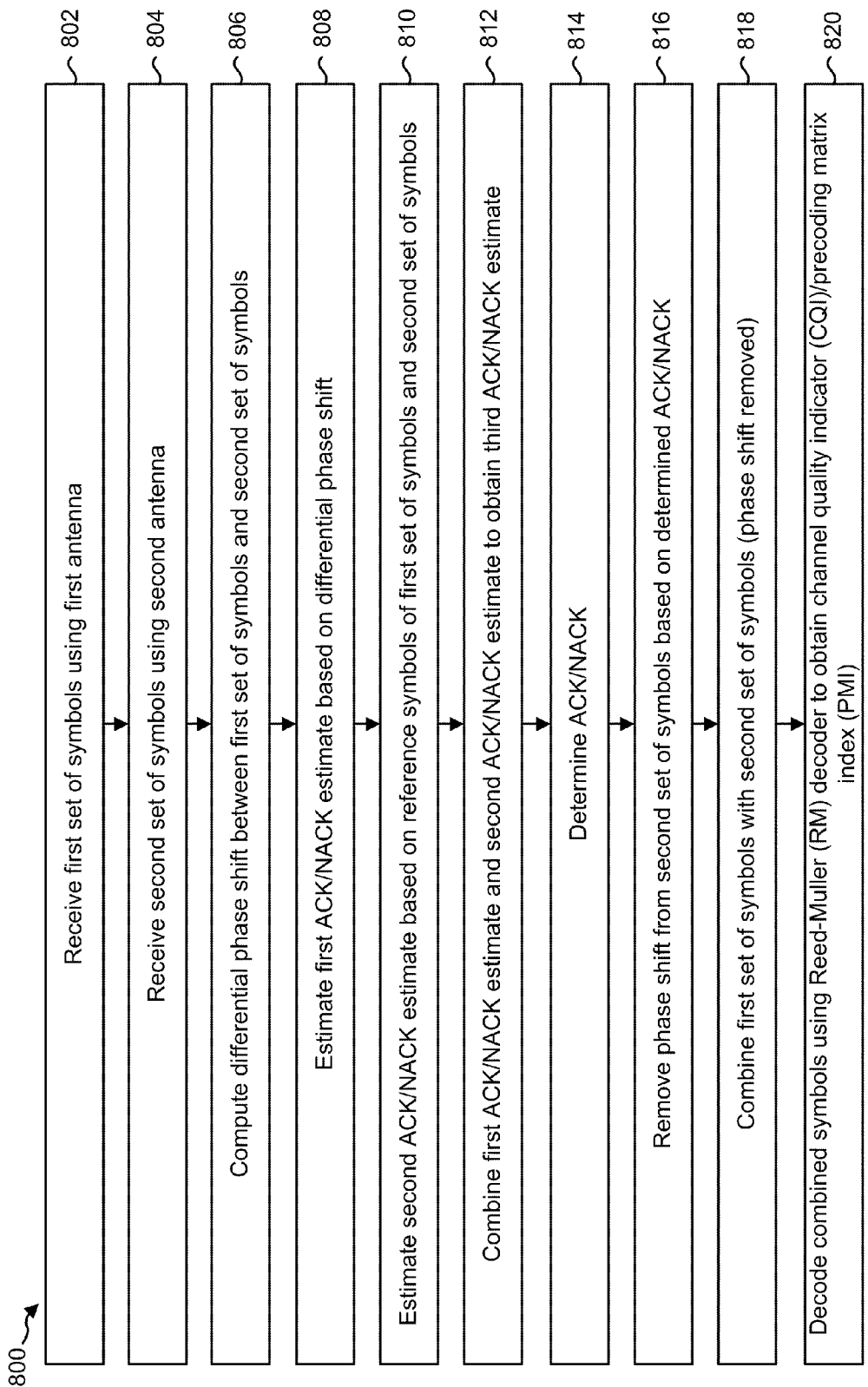
FIG. 8 is a flow diagram illustrating a method for receiving uplink control information (UCI) using a PUCCH transmit diversity scheme.

FIG. 8 is a flow diagram illustrating a method 800 for receiving uplink control information (UCI) 222 using a PUCCH transmit diversity scheme. The method 800 may be performed by a base station 102. The method 800 of FIG. 8 may apply to a PUCCH message 218 using format 2, format 2a or format 2b as per 3GPP TS 36.211. The base station 102 may recover two copies of the ACK/NACK 228. One copy of the ACK/NACK 228 may be from phase shift detection and the other copy of the ACK/NACK 228 may be from the format 2/2a/2b coding. Better performance may be achieved by combining the two ACK/NACK 228 copies to obtain a more reliable ACK/NACK 228 detection. The phase shift may be removed after the detection of the ACK/NACK 228 bits. Thus, the diversity gain for other control information may remain the same as for repetition on the second antenna 110b.

The base station 102 may receive 802 a first set of symbols on a first antenna 110a. The base station 102 may also receive 804 a second set of symbols on a second antenna 110b. The base station 102 may compute 806 the differential phase shift between the first set of symbols and the second set of symbols. Based on the differential phase shift, the base station may estimate 808 a first ACK/NACK estimate. Based on the reference symbols of the first set of symbols and the second set of symbols, the base station 102 may estimate 810 a second ACK/NACK estimate. The base station 102 may then combine 812 the first ACK/NACK estimate and the second ACK/NACK estimate to obtain a third ACK/NACK estimate. Based on the first ACK/NACK estimate, the second ACK/NACK estimate and the third ACK/NACK estimate, the base station 102 may determine 814 the ACK/NACK.

Based on the determined ACK/NACK, the base station 102 may remove 816 a phase shift from the second set of symbols to obtain a second set of symbols (phase shift removed). The base station 102 may then combine 818 the first set of symbols with the second set of symbols (phase shift removed). The base station 102 may decode 820 the combined symbols using a Reed-Muller (RM) decoder to obtain the CQI/PMI. The base station 102 may decode 820 the combined symbols using a Reed-Muller (RM) decoder in cases where a Reed-Muller code was used to encode the UCI.

Figure 9:
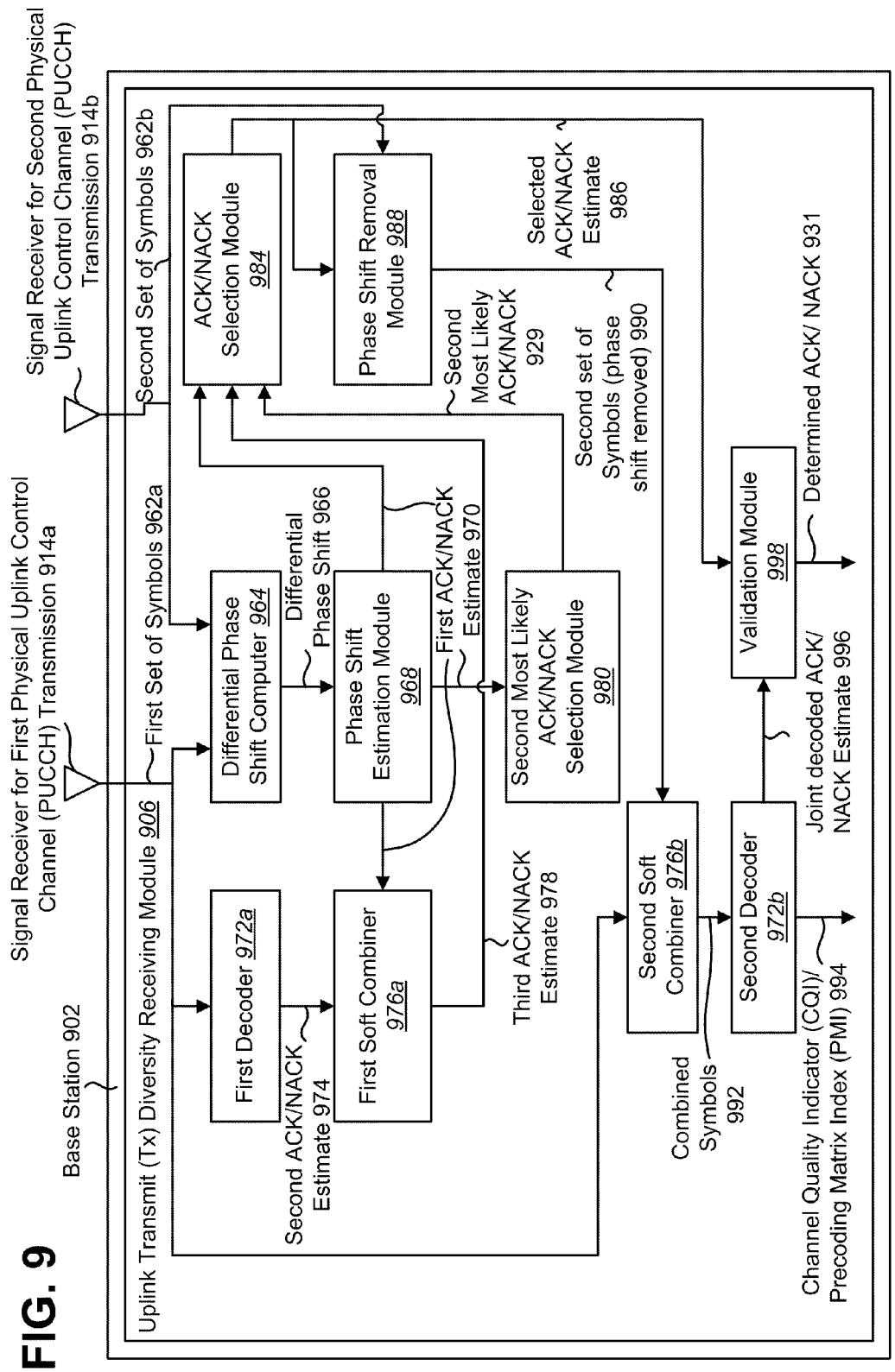
FIG. 9 is a block diagram illustrating data flows for receiving uplink control information (UCI) using a format 2 PUCCH transmit diversity scheme.

FIG. 9 is a block diagram illustrating data flows for receiving uplink control information (UCI) using a format 2 PUCCH transmit diversity scheme. A base station 902 may include an uplink transmit (Tx) diversity receiving module 906. The uplink transmit (Tx) diversity receiving module 906 of FIG. 9 may be one configuration of the uplink transmit (Tx) diversity receiving module 106 of FIG. 1. The base station 902 may also include a signal receiver for the first PUCCH transmission 914*a* and a signal receiver for the second PUCCH transmission 914*b*. The signal receiver for the first PUCCH transmission 914*a* may receive a first set of symbols 962*a*. The signal receiver for the second PUCCH transmission 914*b* may receive a second set of symbols 962*b*. The signal receivers 914 may include two or more antennas. In one configuration, the signal receivers 914 may include four or eight antennas.

The uplink transmit (Tx) diversity receiving module 906 may include a differential phase shift computer 964. The differential phase shift computer 964 may compute a differential phase shift 966 between the first set of symbols 962*a* and the second set of symbols 962*b*. The uplink transmit (Tx) diversity receiving module 906 may also include a phase shift estimation module 968. The phase shift estimation module 968 may estimate a first ACK/NACK estimate 970 based on the computed differential phase shift 966. The first set of symbols 962*a* and the second set of symbols 962*b* may be received and evaluated separately on their respective PUCCH resources. A soft output may be calculated on the log likelihood ratio (LLR) of the second set of symbols 962*b* against each phase shift version of the first set of symbols 962*a*. Then the LLR of each ACK/NACK bit may be obtained.

The first ACK/NACK estimate 970 is approximately equivalent to a 10× differential QPSK (DQPSK) repetition code. The 10× DQPSK repetition code alone is better than the ACK/NACK performance in format 2*a*/2*b* with single antenna transmission, which is equivalent to 2× DQPSK repetitions. An ACK/NACK validation process may provide another level of protection on the ACK/NACK bits. For other information bits, the full transmit diversity gain may be maintained when the ACK/NACK is received correctly. The target bit error rate (BER) of ACK/NACK bits is very small (less than 0.0001). The PUCCH transmit diversity scheme may achieve an even lower BER. Thus, the diversity gain on control is negligible.

The uplink transmit (Tx) diversity receiving module 906 may further include a first decoder 972*a*. The first decoder 972*a* may be a Reed-Muller decoder. The first decoder 972*a* may decode the first set of symbols 962*a* to obtain a second ACK/NACK estimate 974. The first ACK/NACK estimate 974 and the second ACK/NACK estimate 970 may be combined using a first soft combiner 976*a* to obtain a third ACK/NACK estimate 978. Furthermore, besides the first ACK/NACK estimate 970, the phase shift estimation module 968 may provide the likelihoods of ACK/NACK estimation to a second most likely ACK/NACK selection module 980. The second most likely ACK/NACK selection module 980 may then find out which ACK/NACK is to be chosen in case of an ACK/NACK validation conflict.

The uplink transmit (Tx) diversity receiving module 906 may include an ACK/NACK selection module 984. The ACK/NACK selection module 984 may receive the first ACK/NACK estimate 970, the second most likely ACK/NACK estimate 929, and the third ACK/NACK estimate 978. The ACK/NACK selection module 984 may then output a selected ACK/NACK estimate 986. The ACK/NACK selection module 984 may initially select the selected ACK/NACK estimate 986 as the first ACK/NACK estimate 970. Depending on a validation module 998 discussed below, the ACK/NACK selection module 984 may adjust the selected ACK/NACK estimate 986.

The uplink transmit (Tx) diversity receiving module 906 may include a phase shift removal module 988. The phase shift removal module 988 may receive the second set of symbols 962*b* and the selected ACK/NACK estimate 986. Based on the selected ACK/NACK estimate 986, the phase shift removal module 988 may remove a phase shift from the second set of symbols 962*b*. The phase shift removal module 988 may output a second set of symbols (phase shift removed) 990.

The uplink transmit (Tx) diversity receiving module 906 may include a second soft combiner 976*b*. The second soft combiner 976*b* may receive the first set of symbols 962*a* and the second set of symbols (phase shift removed) 990. The second soft combiner 976*b* may then combine the first set of symbols 962*a* and the second set of symbols (phase shift removed) 990 to output combined symbols 992. The combined symbols 992 may be input into a second decoder 972*b*. The second decoder 972*b* may be a Reed-Muller decoder. The second decoder 972*b* may output the CQI/PMI 994 and a joint decoded ACK/NACK estimate 996.

The uplink transmit (Tx) diversity receiving module 906 may include a validation module 998. The validation module 998 may receive the selected ACK/NACK estimate 986 and the joint decoded ACK/NACK estimate 996. Normally, the independent estimates of the ACK/NACK should verify each other. Thus, the selected ACK/NACK estimate 986 should match the joint decoded ACK/NACK estimate 996. If the selected ACK/NACK estimate 986 matches the joint decoded ACK/NACK estimate 996, the joint decoded ACK/NACK estimate 996 may be output by the validation module 998 as the determined ACK/NACK 931.

In rare cases when different results are obtained (i.e. when the selected ACK/NACK estimate 986 and the joint decoded ACK/NACK estimate 996 differ by more than a threshold), the ACK/NACK selection module 984 may select the third ACK/NACK estimate 978 as the selected ACK/NACK estimate 986. The phase shift removing module 988, second soft combiner 976*b* and second decoder 972*b* may then restart to obtain a new joint decoded ACK/NACK estimate 996. If the results match, the validation module 998 may output the joint decoded ACK/NACK estimate 986 as the determined ACK/NACK 931. If the results are still different, the ACK/NACK selection module 984 may select the second most likely ACK/

NACK 929 as the selected ACK/NACK estimate 986. The phase shift removing module 988, second soft combiner 976*b* and second decoder 972*b* may then restart to obtain a new joint decoded ACK/NACK estimate 996. If the results match, the validation module 998 may output the joint decoded ACK/NACK estimate 996 as the determined ACK/NACK 931.

If the new joint decoded ACK/NACK estimate 996 still does not match the selected ACK/NACK estimate 986, the validation module 998 may select the determined ACK/NACK 931 based on the number of bits of the CQI/PMI and the ACK/NACK, along with the second decoder 972*b* output when the selected ACK/NACK estimate 986 is the third ACK/NACK estimate 978 and when the selected ACK/NACK estimate 986 is the second most likely ACK/NACK 929. The decision from the phase shift estimation module 968 will be more reliable when the number of information bits is large. Furthermore, with multiple orthogonal resources, the reference symbols may also be used to convey the ACK/NACK signal in format 2 with extended CP. The coding/decoding process may then be simplified and become very similar to that of format 2*a*/2*b* discussed below in relation to FIG. 11 and FIG. 12.

Figure 10:
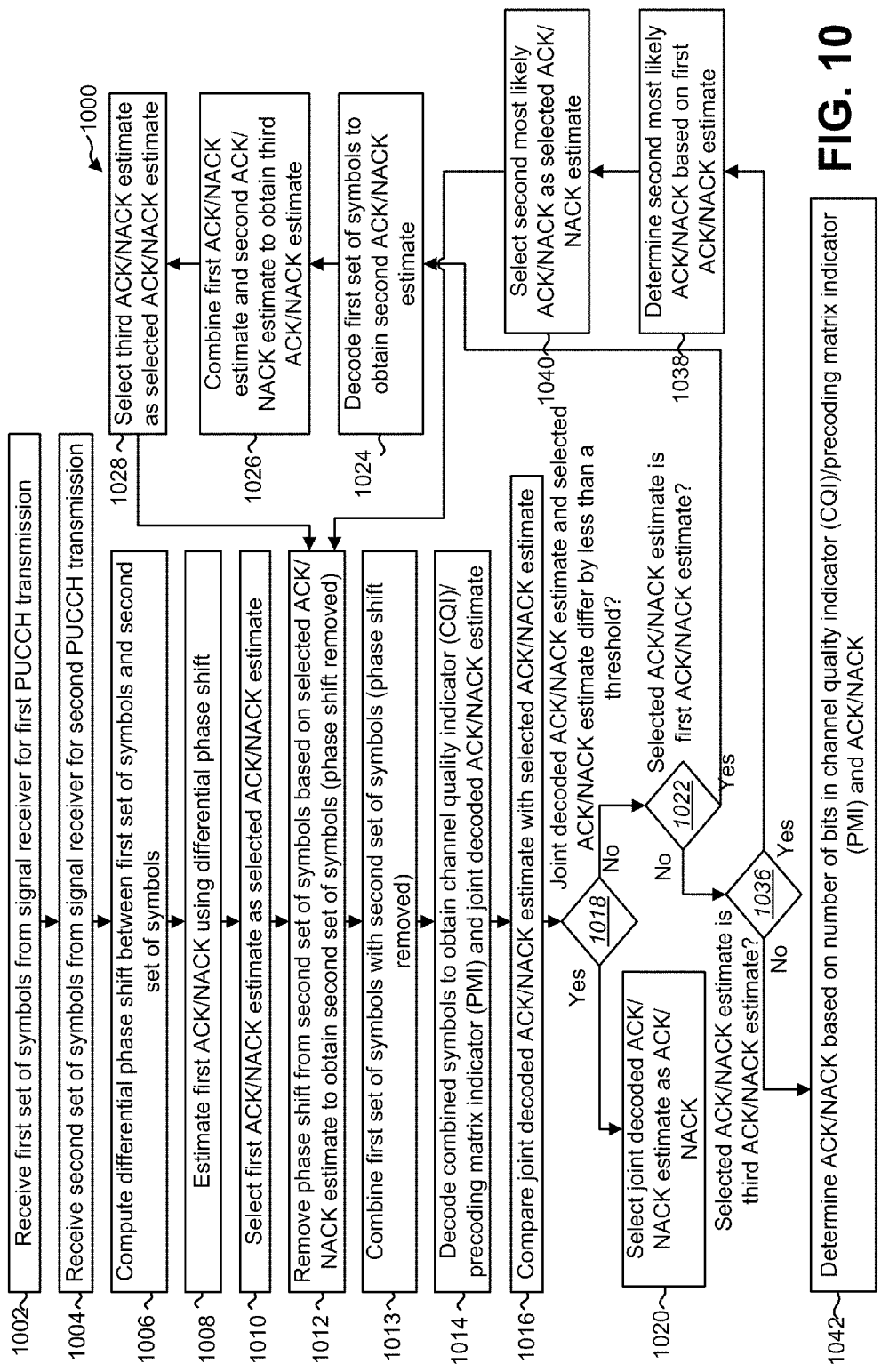
FIG. 10 is a flow diagram of a method for receiving uplink control information (UCI) using a format 2 PUCCH transmit diversity scheme.

FIG. 10 is a flow diagram of a method 1000 for receiving uplink control information (UCI) 222 using a format 2 PUCCH transmit diversity scheme. The method 1000 may be performed by a base station 902. The base station 902 may receive 1002 a first set of symbols 962*a* from a signal receiver for the first physical uplink control channel (PUCCH) transmission 914*a*. The base station 902 may receive 1004 a second set of symbols 962*b* from a signal receiver of a second physical uplink control channel (PUCCH) transmission 914*b*. The base station 902 may compute 1006 a differential phase shift 966 between the first set of symbols 962*a* and the second set of symbols 962*b*. The base station 902 may then estimate 1008 a first ACK/NACK estimate 970 using the differential phase shift 966. The base station 902 may select 1010 the first ACK/NACK estimate 970 as the selected ACK/NACK estimate 986.

The base station 902 may next remove 1012 a phase shift from the second set of symbols 962*b* based on the selected ACK/NACK estimate 986 to obtain a second set of symbols (phase shift removed) 990. The base station 902 may combine 1013 the first set of symbols 962*a* with the second set of symbols (phase shift removed) 990. The base station 902 may then decode 1014 the combined symbols 992 to obtain a CQI/PMI 994 and a joint decoded ACK/NACK estimate 996. The base station 902 may compare 1016 the joint decoded ACK/NACK estimate 996 with the selected ACK/NACK estimate 986. The base station 902 may then determine 1018 whether the joint decoded ACK/NACK estimate 996 and the selected ACK/NACK estimate 986 differ by less than a threshold. If the joint decoded ACK/NACK estimate 996 and the selected ACK/NACK estimate 986 differ by less than a threshold, the base station 902 may select 1020 the joint decoded ACK/NACK estimate 996 as the ACK/NACK 931 with great confidence.

If the joint decoded ACK/NACK estimate 996 and the selected ACK/NACK estimate 986 do not differ by less than a threshold, the base station 902 may next determine 1022 if the selected ACK/NACK estimate 986 is the first ACK/NACK estimate 970. If the selected ACK/NACK estimate 986 is the first ACK/NACK estimate 970, the base station 902 may decode 1024 the first set of symbols 962*a* to obtain a second ACK/NACK estimate 974. The base station 902 may decode 1024 the first set of symbols 962*a* using a Reed-Muller decoder. The base station 902 may then combine 1026 the first ACK/NACK estimate 970 and the second ACK/NACK estimate 974 to obtain a third ACK/NACK estimate 978. The base station 902 may select 1028 the third ACK/NACK estimate 978 as the selected ACK/NACK estimate 986. The base station 902 may then remove 1012 a phase shift 966 from the second set of symbols 962*b* based on the selected ACK/NACK estimate 986.

If the selected ACK/NACK estimate 986 is not the first ACK/NACK estimate 970, the base station 902 may determine 1036 whether the selected ACK/NACK estimate 986 is the third ACK/NACK estimate 978. If the selected ACK/NACK estimate 986 is the third ACK/NACK estimate 978, the base station 902 may determine 1038 a second most likely ACK/NACK 929 based on the first ACK/NACK estimate 970. The base station 902 may select 1040 the second most likely ACK/NACK 929 as the selected ACK/NACK estimate 986. The base station 902 may then remove 1012 a phase shift 966 from the second set of symbols 962*b* based on the selected ACK/NACK estimate 986.

If the selected ACK/NACK estimate 986 is not the third ACK/NACK estimate 978, the base station 902 may determine 1042 the ACK/NACK 931 based on the number of bits in the CQI/PMI 994 and the ACK/NACK 996. The base station 902 may also determine the ACK/NACK 929 based on the second decoder 972*b* output when the selected ACK/NACK estimate 986 is the third ACK/NACK estimate 978. The base station 902 may further determine the ACK/NACK 929 based on the second decoder 972*b* output when the selected ACK/NACK estimate 986 is the second most likely ACK/NACK 929.

Figure 11:
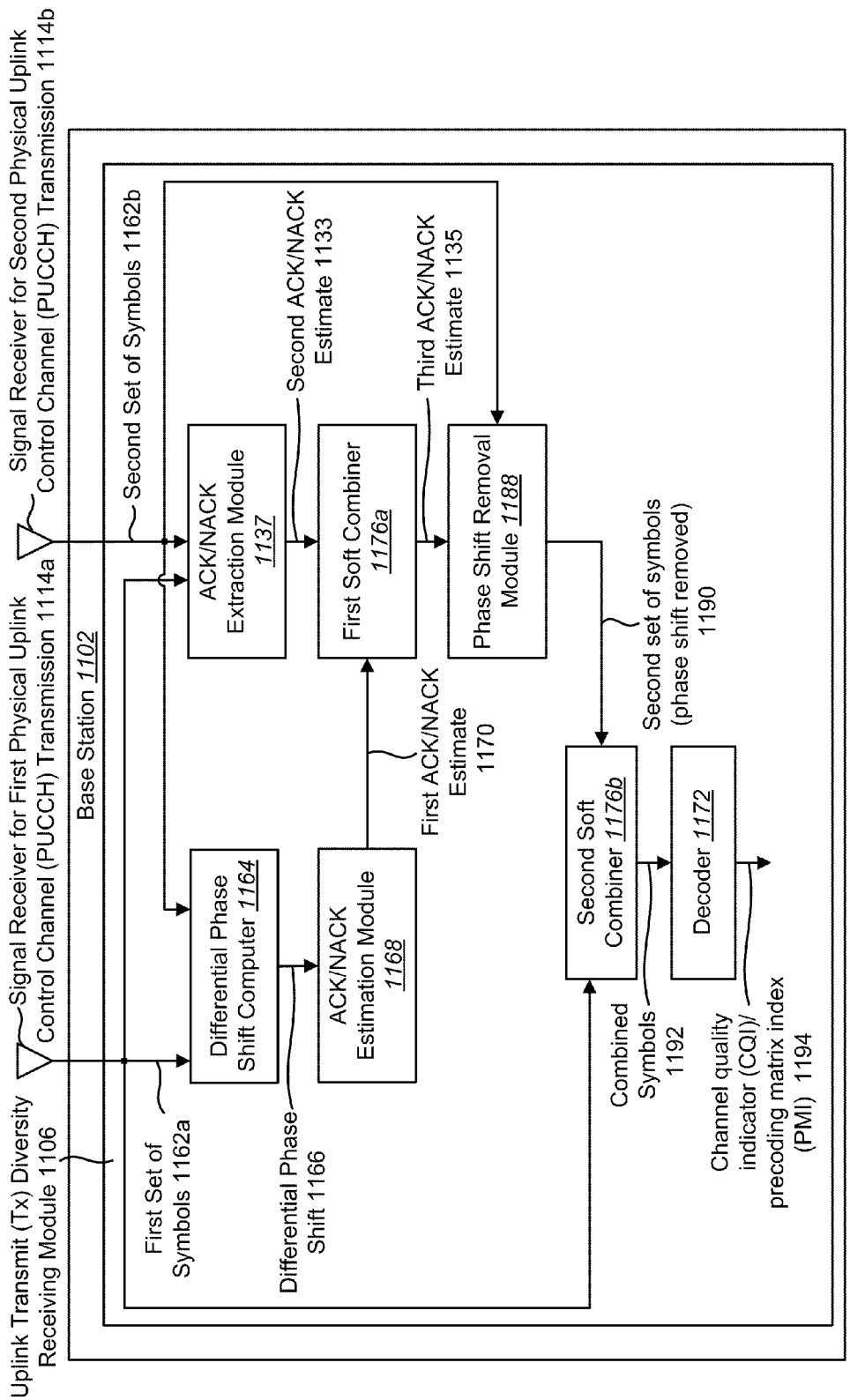
FIG. 11 is a block diagram illustrating data flows for receiving uplink control information (UCI) using a format 2a/2b PUCCH transmit diversity scheme.

FIG. 11 is a block diagram illustrating data flows for receiving uplink control information (UCI) 222 using a format 2*a*/2*b* PUCCH transmit diversity scheme. A base station 1102 may include an uplink transmit (Tx) diversity receiving module 1106. The uplink transmit (Tx) diversity receiving module 1106 of FIG. 11 may be one configuration of the uplink transmit (Tx) diversity receiving module 106 of FIG. 1. The base station 1102 may also include a signal receiver for the first PUCCH transmission 1114*a* and a signal receiver for the second PUCCH transmission 1114*b*. The signal receiver for the first PUCCH transmission 1114*a* may receive a first set of symbols 1162*a*. The signal receiver for the second PUCCH transmission 1114*b* may receive a second set of symbols 1162*b*. The first set of symbols 1162*a* and the second set of symbols 1162*b* may be received via the PUCCH.

The uplink transmit (Tx) diversity receiving module 1106 may include a differential phase shift computer 1164. The differential phase shift computer 1164 may receive the first set of symbols 1162*a* and the second set of symbols 1162*b*. The differential phase shift computer 1164 may then compute the differential phase shift 1166 between the first set of symbols 1162*a* and the second set of symbols 1162*b*. The uplink transmit (Tx) diversity receiving module 1106 may also include an ACK/NACK estimation module 1168. The ACK/NACK estimation module 1168 may also be referred to as a phase shift estimation module. The ACK/NACK estimation module 1168 may receive the differential phase shift 1166. The ACK/NACK estimation module 1168 may then estimate a first ACK/NACK estimate 1170 based on the differential phase shift 1166.

If a 2-bit ACK/NACK feedback is assumed, the format 2*b* may be equivalent to a 2× differential QPSK (DQPSK) repetition on each antenna. Thus, the format 2*b* may be equivalent to an approximately 4× DQPSK repetition with two antennas. The phase shift estimation is essentially also a DQPSK demodulation. Thus, the ACK/NACK estimate from the phase shift detection is approximately equivalent to a 10×

QPSK repetition code. Combined with the format 2b transmission on two antennas results in ~14× DQPSK repetition. Thus, up to 5.4 dB (10*log 10(14/4)) gain over the simple repetition transmit diversity method. For other information bits, when the ACK/NACK is received correctly, full transmit diversity gain is maintained and there is no diversity gain when the ACK/NACK is in error.

The uplink transmit (Tx) diversity receiving module 1106 may include an ACK/NACK extraction module 1137. The ACK/NACK extraction module 1137 may receive the first set of symbols 1162a and the second set of symbols 1162b. The ACK/NACK extraction module 1137 may then extract the ACK/NACK from the reference symbols of the first set of symbols and the second set of symbols. The extracted ACK/NACK may be referred to as the second ACK/NACK estimate 1133.

The uplink transmit (Tx) diversity receiving module 1106 may include a first soft combiner 1176a. The first soft combiner 1176a may combine the first ACK/NACK estimate 1170 and the second ACK/NACK estimate 1133 to obtain a third ACK/NACK estimate 1135. The third ACK/NACK estimate 1135 may be a more accurate estimate of the ACK/NACK and may be used as the ACK/NACK decision. The uplink transmit (Tx) diversity receiving module 1106 may include a phase shift removal module 1188. Based on the third ACK/NACK estimate 1135, the phase shift removal module 1188 may remove a phase shift from the second set of symbols 1162b. The phase shift removal module 1188 may then output the second set of symbols (phase shift removed) 1190.

The uplink transmit (Tx) diversity receiving module 1106 may include a second soft combiner 1176b. The second soft combiner 1176b may combine the first set of symbols 1162a and the second set of symbols (phase shift removed) 1190. The combined symbols 1192 may then be decoded by a decoder 1172. The decoder 1172 may be a Reed-Muller decoder 1172. The decoder 1172 may output the channel quality indicator (CQI)/precoding matrix index (PMI) 1194.

Figure 12:
FIG. 12 is a flow diagram of a method for receiving uplink control information (UCI) using a format 2a/2b PUCCH transmit diversity scheme.

FIG. 12 is a flow diagram of a method 1200 for receiving uplink control information (UCI) 222 using a format 2a/2b PUCCH transmit diversity scheme. The method 1200 may be performed by a base station 1102. The base station 1102 may receive 1202 a first set of symbols 1162a by a signal receiver for the first PUCCH transmission 1114a. The base station 1102 may receive 1204 a second set of symbols 1162b by a signal receiver for the second PUCCH transmission 1114b. The base station 1102 may then compute 1206 a differential phase shift 1166 between the first set of symbols 1162a and the second set of symbols 1162b.

Using the differential phase shift 1166, the base station 1102 may estimate 1208 a first ACK/NACK estimate 1170. The base station 1102 may also extract 1210 a second ACK/NACK estimate 1133 from the reference symbols 648 of the first set of symbols 1162a and the second set of symbols 1162b. The base station 1102 may combine 1212 the first ACK/NACK estimate 1170 and the second ACK/NACK estimate 1133 to obtain a third ACK/NACK estimate 1135. The third ACK/NACK estimate 1135 may be a more accurate estimate of the ACK/NACK and may be used as the ACK/NACK decision.

Using the third ACK/NACK estimate 1135, the base station 1102 may remove 1214 a phase shift from the second set of symbols 1162b. The base station 1102 may next combine 1216 the first set of symbols 1162a with the second set of symbols (phase shift removed) 1190. The base station 1102 may then decode 1218 the combined symbols 1192 to obtain the channel quality indicator (CQI)/precoding matrix index (PMI) 1194. The base station 1102 may decode 1218 the combined symbols 1192 using a Reed-Muller decoder 1172.

Figure 13:
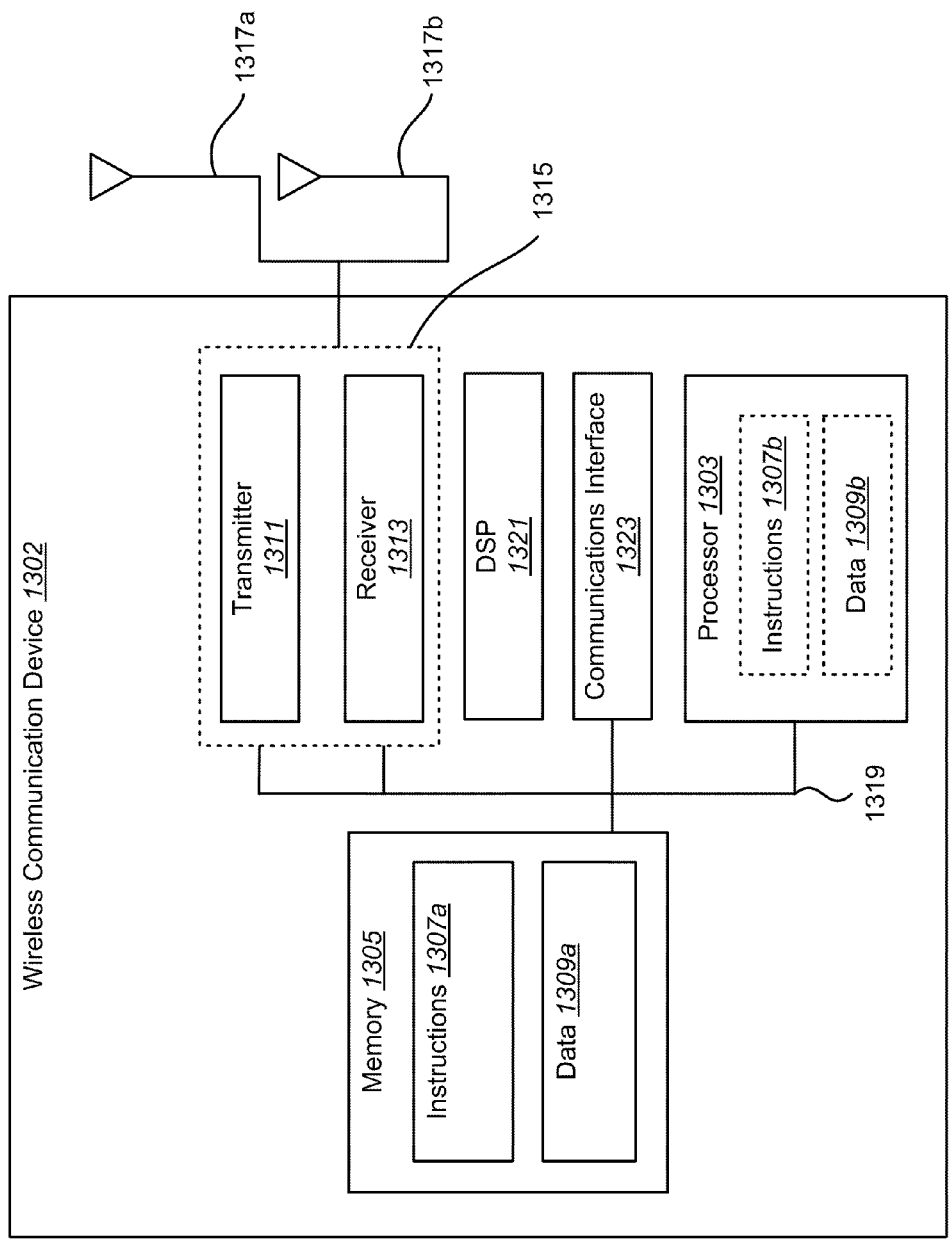
FIG. 13 illustrates various components that may be utilized in a wireless communication device.

FIG. 13 illustrates various components that may be utilized in a wireless communication device 1302. The wireless communication device 1302 includes a processor 1303 that controls operation of the wireless communication device 1302. The processor 1303 may also be referred to as a CPU. Memory 1305, which may include both read-only memory (ROM), random access memory (RAM) or any type of device that may store information, provides instructions 1307a and data 1309a to the processor 1303. A portion of the memory 1305 may also include non-volatile random access memory (NVRAM). Instructions 1307b and data 1309b may also reside in the processor 1303. Instructions 1307b loaded into the processor 1303 may also include instructions 1307a from memory 1305 that were loaded for execution by the processor 1303. The instructions 1307b may be executed by the processor 1303 to implement the methods disclosed herein.

The wireless communication device 1302 may also include a housing that contains a transmitter 1311 and a receiver 1313 to allow transmission and reception of data. The transmitter 1311 and receiver 1313 may be combined into a transceiver 1315. A first antenna 1317a and a second antenna 1317b are attached to the housing and electrically coupled to the transceiver 1315. Additional antennas may also be used.

The various components of the wireless communication device 1302 are coupled together by a bus system 1319 which may include a power bus, a control signal bus, and a status signal bus, in addition to a data bus. However, for the sake of clarity, the various buses are illustrated in FIG. 13 as the bus system 1319. The wireless communication device 1302 may also include a digital signal processor (DSP) 1321 for use in processing signals. The wireless communication device 1302 may also include a communications interface 1323 that provides user access to the functions of the communication device 1302. The wireless communication device 1302 illustrated in FIG. 13 is a functional block diagram rather than a listing of specific components.

Figure 14:
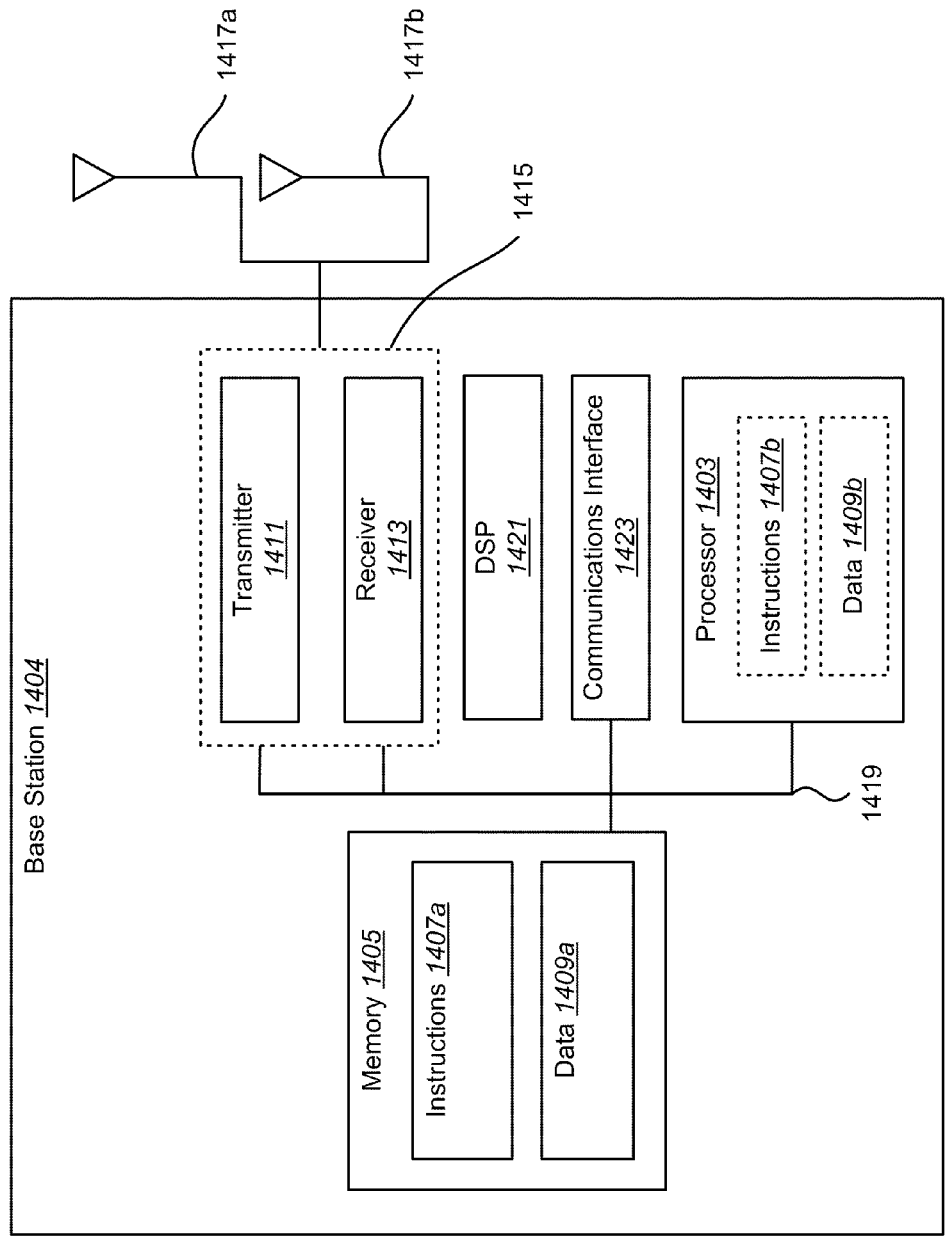
FIG. 14 illustrates various components that may be utilized in a base station.

FIG. 14 illustrates various components that may be utilized in a base station 1404. The base station 1404 may include components that are similar to the components discussed above in relation to the wireless communication device 1302, including a processor 1403, memory 1405 that provides instructions 1407a and data 1409a to the processor 1403, instructions 1407b and data 1409b that may reside in the processor 1403, a housing that contains a transmitter 1411 and a receiver 1413 (which may be combined into a transceiver 1415), a first antenna 1417a and a second antenna 1417b electrically coupled to the transceiver 1415, a bus system 1419, a DSP 1421 for use in processing signals, a communications interface 1423, and so forth.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory may be integral to a processor and still be said to be in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for receiving uplink control information (UCI) using a physical uplink control channel (PUCCH) transmit diversity scheme, comprising:
    receiving a first set of symbols by a first signal receiver for a first PUCCH transmission;
    receiving a second set of symbols by a second signal receiver for a second PUCCH transmission;
    estimating a first acknowledge/negative-acknowledge (ACK/NACK) estimate;
    removing a phase shift from the second set of symbols based on the first ACK/NACK estimate to obtain a third set of symbols;
    combining the first set of symbols with the third set of symbols to obtain a fourth set of symbols; and
    decoding the fourth set of symbols to obtain the UCI.

2. The method of claim 1, further comprising:
    computing a differential phase shift between the first set of symbols and the second set of symbols, wherein the first ACK/NACK estimate is based on the differential phase shift.

3. The method of claim 2, further comprising extracting a second ACK/NACK estimate from one or more reference symbols in the first set of symbols and the second set of symbols.

4. The method of claim 3, wherein a third ACK/NACK estimate is a combination of the first ACK/NACK estimate and the second ACK/NACK estimate.

5. The method of claim 1, wherein the method is performed by a base station configured to operate using a single or multiple antennas.

6. The method of claim 1, wherein decoding is performed using a Reed-Muller decoder if the UCI was encoded using a Reed-Muller coder.

7. The method of claim 1, wherein the UCI is sent using PUCCH format 2*a*/2*b*.

8. The method of claim 7, wherein the method is performed by a base station configured to operate using a single or multiple antennas.

9. The method of claim 7, wherein decoding is performed using a Reed-Muller decoder if the UCI was encoded using a Reed-Muller coder.

10. The method of claim 7, wherein the UCI was sent using PUCCH format 2.

11. A method for receiving uplink control information (UCI) using a physical uplink control channel (PUCCH) transmit diversity scheme, comprising:
    receiving a first set of symbols by a first signal receiver for a first PUCCH transmission;
    receiving a second set of symbols by a second signal receiver for a second PUCCH transmission;
    computing a differential phase shift between the first set of symbols and the second set of symbols;
    estimating a first acknowledge/negative-acknowledge (ACK/NACK) estimate based on the differential phase shift;
    removing a phase shift from the second set of symbols based on the first ACK/NACK estimate to obtain a third set of symbols;
    combining the first set of symbols with the third set of symbols to obtain a fourth set of symbols; and
    decoding the fourth set of symbols to obtain a first UCI, wherein the first UCI comprises a joint decoded ACK/NACK estimate.

12. The method of claim 11, further comprising determining whether the first ACK/NACK estimate and the joint decoded ACK/NACK estimate differ by less than a threshold, and selecting the joint decoded ACK/NACK estimate as the ACK/NACK if the first ACK/NACK estimate and the joint decoded ACK/NACK estimate differ by less than a threshold.

13. The method of claim 11, further comprising determining whether the first ACK/NACK estimate and the joint decoded ACK/NACK estimate differ by less than a threshold, and decoding the first set of symbols to obtain a second ACK/NACK estimate if the first ACK/NACK estimate and the joint decoded ACK/NACK estimate differ by more than a threshold.

14. The method of claim 13, further comprising:
combining the first ACK/NACK estimate and the second ACK/NACK estimate to obtain a third ACK/NACK estimate;
removing a phase shift from the second set of symbols based on the third ACK/NACK estimate to obtain a fifth set of symbols;
combining the fifth set of symbols with the first set of symbols to obtain a sixth set of symbols;
decoding the sixth set of symbols to obtain a second UCI, wherein the second UCI comprises a joint decoded fourth ACK/NACK estimate.

15. The method of claim 14, further comprising determining whether the third ACK/NACK estimate and the joint decoded fourth ACK/NACK estimate differ by less than a threshold, and selecting the joint decoded ACK/NACK estimate as the ACK/NACK if the third ACK/NACK estimate and the joint decoded fourth ACK/NACK estimate differ by less than a threshold.

16. The method of claim 14, further comprising determining whether the third ACK/NACK estimate and the joint decoded fourth ACK/NACK estimate differ by less than a threshold, and determining a fifth ACK/NACK estimate based on the first ACK/NACK estimate if the third ACK/NACK estimate and the joint decoded fourth ACK/NACK estimate differ by more than a threshold.

17. The method of claim 16, further comprising:
removing a phase shift from the second set of symbols based on the fifth ACK/NACK estimate to obtain a seventh set of symbols;
combining the seventh set of symbols with the first set of symbols to obtain an eighth set of symbols;
decoding the eighth set of symbols to obtain a third UCI, wherein the third UCI comprises a joint decoded sixth ACK/NACK estimate.

18. The method of claim 17, further comprising determining whether the fifth ACK/NACK estimate and the joint decoded sixth ACK/NACK estimate differ by less than a threshold, and selecting the joint decoded sixth ACK/NACK estimate as the ACK/NACK if the fifth ACK/NACK estimate and the joint decoded sixth ACK/NACK estimate differ by less than a threshold.

19. The method of claim 17, further comprising determining whether the fifth ACK/NACK estimate and the joint decoded sixth ACK/NACK estimate differ by less than a threshold, and determining the ACK/NACK based on the number of bits in the third UCI if the fifth ACK/NACK estimate and the joint decoded sixth ACK/NACK estimate differ by more than a threshold.

20. A base station configured for receiving uplink control information (UCI) using a physical uplink control channel (PUCCH) transmit diversity scheme, the base station comprising:
a first signal receiver for a first PUCCH transmission, wherein the first signal receiver receives a first set of symbols;
a second signal receiver for a second PUCCH transmission, wherein the second signal receiver receives a second set of symbols;
a differential phase shift computer, wherein the differential phase shift computer computes the differential phase shift between the first set of symbols and the second set of symbols;
a phase shift estimation module, wherein the phase shift estimation module estimates a first acknowledge/negative-acknowledge (ACK/NACK) estimate based on the differential phase shift;
a phase shift removal module, wherein the phase shift removal module removes a phase shift from the second set of symbols to obtain a third set of symbols;
a first combiner; wherein the first combiner combines the first set of symbols and the third set of symbols to obtain a fourth set of symbols; and
a first decoder, wherein the first decoder decodes the fourth set of symbols to obtain the UCI.

21. The base station of claim 20, further comprising:
an ACK/NACK extraction module, wherein the ACK/NACK extraction module extracts a second ACK/NACK estimate from one or more reference symbols of the first set of symbols and the second set of symbols; and
a second combiner; wherein the second combiner combines the first ACK/NACK estimate and the second ACK/NACK estimate to obtain a third ACK/NACK estimate, and wherein the phase shift removed from the second set of symbols is based on the third ACK/NACK estimate.

22. The base station of claim 20, further comprising:
a second decoder, wherein the second decoder decodes a second ACK/NACK estimate from the first set of symbols;
a second combiner, wherein the second combiner combines the first ACK/NACK estimate and the second ACK/NACK estimate to obtain a third ACK/NACK estimate, and wherein the UCI output by the first decoder comprises a channel quality indicator (CQI), a precoding matrix index (PMI) and a fourth ACK/NACK estimate ; and
a validation module, wherein the validation module determines the validity of the fourth ACK/NACK estimate.

* * * * *

UNITED STATES PATENT AND TRADEMARK OFFICE
CERTIFICATE OF CORRECTION

PATENT NO. : 8,374,136 B2  
APPLICATION NO. : 12/573016  
DATED : February 12, 2013  
INVENTOR(S) : Zhanping Yin Page 1 of 1

It is certified that error appears in the above-identified patent and that said Letters Patent is hereby corrected as shown below:

In the Specification

In column 9, line 1 please delete "PUCCH 216, PUCCH" and replace it with --PUCCH 216, PUSCH--.

Signed and Sealed this  
Twelfth Day of November, 2013

Teresa Stanek Rea  
*Deputy Director of the United States Patent and Trademark Office*